(12) United States Patent
Bok et al.

(10) Patent No.: US 11,587,999 B2
(45) Date of Patent: Feb. 21, 2023

(54) DISPLAY PANEL INCLUDING AN EXTENDED DISPLAY AREA AND DISPLAY DEVICE INCLUDING THE SAME

(71) Applicant: Samsung Display Co., Ltd., Yongin-si (KR)

(72) Inventors: Seunglyong Bok, Yongin-si (KR); Youngran Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

(21) Appl. No.: 17/089,892

(22) Filed: Nov. 5, 2020

(65) Prior Publication Data

US 2021/0193769 A1 Jun. 24, 2021

(30) Foreign Application Priority Data

Dec. 18, 2019 (KR) .......................... 10-2019-0170207

(51) Int. Cl.
*H01L 27/32* (2006.01)
*G06F 1/16* (2006.01)
(Continued)

(52) U.S. Cl.
CPC ........ *H01L 27/3267* (2013.01); *G06F 1/1605* (2013.01); *G09F 9/372* (2013.01); *H01L 25/167* (2013.01); *H01L 27/3227* (2013.01)

(58) Field of Classification Search
CPC ............... H01L 27/3267; H01L 25/167; H01L 27/3227; H01L 27/3218; H01L 27/3225;
(Continued)

(56) References Cited

U.S. PATENT DOCUMENTS 9,081,453 B2 7/2015 Bulea et al.
9,112,112 B2 8/2015 Do et al.
(Continued)

FOREIGN PATENT DOCUMENTS

JP 2019078890 A * 5/2019 ........... G02F 1/1347
KR 10-2012-0122159 A 11/2012
(Continued)

OTHER PUBLICATIONS

Richard Lai, "Oppo's under-screen camera is real and taking photos in Shanghai," Web page <https://www.engadget.com/2019-06-26-oppo-under-screen-camera-mwc-shanghai.html>, Jun. 26, 2019, 4 pages, retrieved from Internet Archive Wayback Machine <http://web.archive.org/web/20200903180213/https://www.engadget.com/2019-06-26-oppo-under-screen-camera-mwc-shanghai.html> on Nov. 4, 2020.

*Primary Examiner* — Donald L Raleigh
(74) *Attorney, Agent, or Firm* — Lewis Roca Rothgerber Christie LLP

(57) ABSTRACT

A display device includes: a first display panel configured to emit light in a first direction from first display elements to display an image, the first display panel including a main display area and a component area; a second display panel arranged under the first display panel and including a second display area configured to emit light in the first direction from second display elements to display an image; and a component arranged below the first display panel and configured to receive light from outside of the display device.

20 Claims, 28 Drawing Sheets

(51) Int. Cl.
*G09F 9/37* (2006.01)
*H01L 25/16* (2023.01)

(58) Field of Classification Search
CPC ........... H01L 27/3276; H01L 2251/558; H01L 27/3234; H01L 27/326; H01L 27/3246; H01L 27/3248; H01L 27/3262; H01L 27/3279; H01L 27/3216; H01L 27/3244; H01L 51/52; G06F 1/1605; G09F 9/372
See application file for complete search history.

(56) References Cited

U.S. PATENT DOCUMENTS

| | | |
|---|---|---|
| 9,741,973 B2 | 8/2017 | Song et al. |
| 9,773,761 B2 | 9/2017 | Do |
| 10,249,603 B2 | 4/2019 | Cho et al. |
| 10,368,022 B2 | 7/2019 | Wan |
| 2018/0143669 A1 | 5/2018 | Bok et al. |
| 2018/0157357 A1 | 6/2018 | Lin et al. |
| 2019/0004640 A1 | 1/2019 | Ye |
| 2019/0130822 A1 | 5/2019 | Jung et al. |

FOREIGN PATENT DOCUMENTS

| | | |
|---|---|---|
| KR | 10-2015-0006798 A | 1/2015 |
| KR | 10-2016-0097400 A | 8/2016 |
| KR | 10-2017-0113066 A | 10/2017 |
| KR | 10-2018-0057796 A | 5/2018 |
| KR | 10-2019-0009637 A | 1/2019 |
| KR | 10-1987196 B1 | 6/2019 |

\* cited by examiner

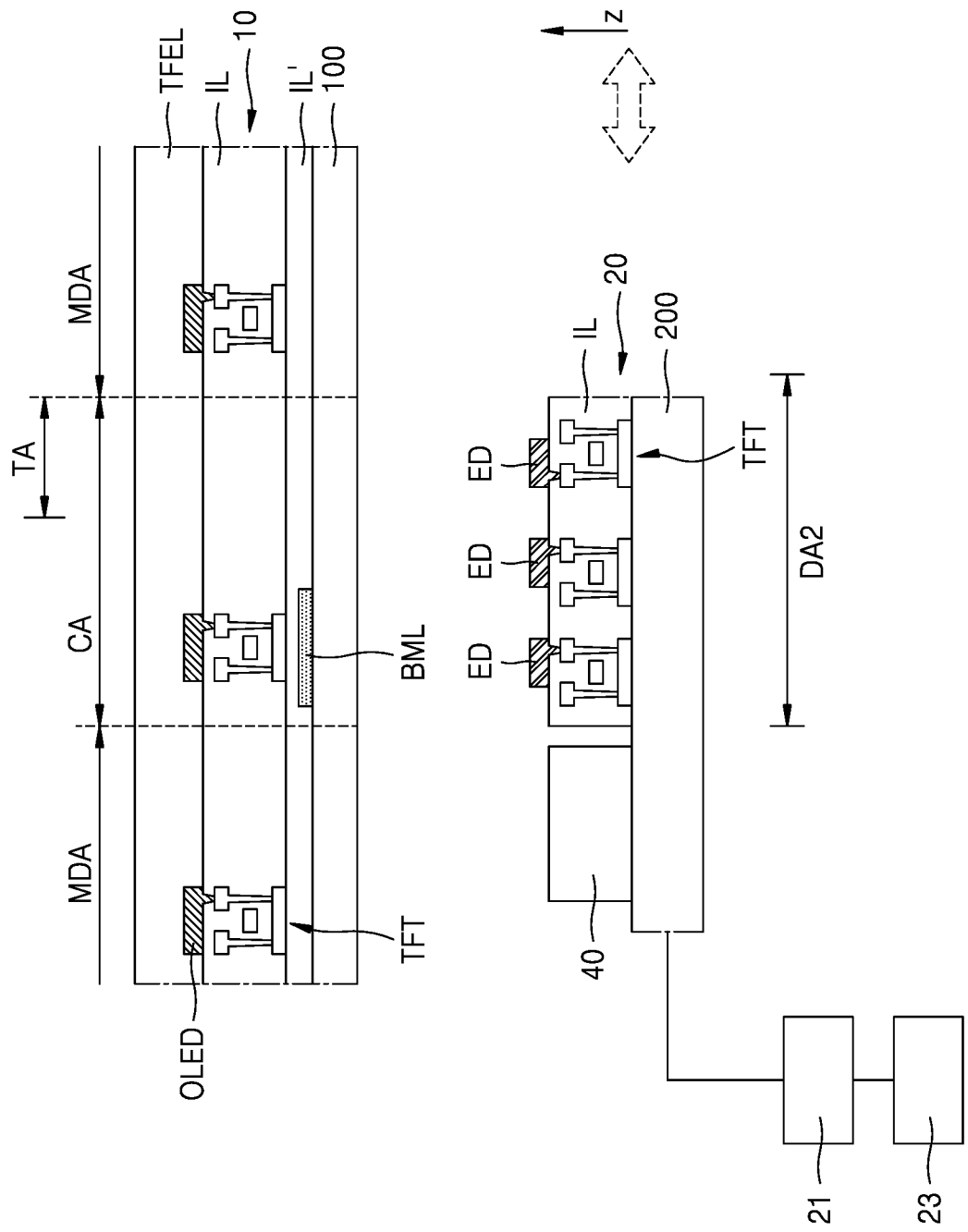

DISPLAY PANEL INCLUDING AN EXTENDED DISPLAY AREA AND DISPLAY DEVICE INCLUDING THE SAME

CROSS-REFERENCE TO RELATED APPLICATION

This application claims priority to and the benefit of Korean Patent Application No. 10-2019-0170207, filed on Dec. 18, 2019, in the Korean Intellectual Property Office, the entire disclosure of which is incorporated by reference herein.

BACKGROUND

1. Field

One or more embodiments of the present disclosure relate to a display panel and a display device including the same, and more particularly, to a display panel including an extended display area such that an image may be displayed even in a region in which an electronic component is arranged, and a display device including the display panel.

2. Description of Related Art

Recently, the usage of display devices has diversified. In addition, as display devices have become thinner and lighter, their range of use has gradually been extended.

Display devices are used in various ways, and as a result they have been designed to have various shapes. Also, functions that may be combined or associated with display devices are increasing.

SUMMARY

One or more embodiments include a display panel including an extended display area such that an image may be displayed even in a region in which a component, which is an electronic element, is arranged, and a display device including the display panel. However, it should be understood that embodiments described herein are for descriptive purposes only and are not for limitation of the disclosure.

Additional aspects will be set forth in part in the description which follows and, in part, will be apparent from the description, or may be learned by practice of the presented embodiments of the disclosure.

According to one or more embodiments, a display device includes a first display panel configured to emit light in a first direction from first display elements to display an image, the first display panel including a main display area and a component area, a second display panel under the first display panel and including a second display area configured to emit light in the first direction from second display elements to display an image, and a component arranged below the first display panel and configured to receive light from outside of the display device.

The second display elements may correspond to an edge of the component area, and the component may overlap the component area.

When the display device is in use and displaying an image, the image displayed on the second display panel by the second display elements may be displayed in cooperation with an image displayed in the component area.

The display device may further include a movement driver configured to move the second display panel relative to the first display panel, and a controller configured to control the movement driver, wherein the component may be on the second display panel and on one side of the second display area.

The movement driver may be configured to move the second display panel according to a command of the controller such that the component corresponds to the component area when the component is operating, and the movement driver may move the second display panel according to a command of the controller such that the second display area corresponds to the component area when the component is not operating.

The component area may include a first component area and a second component area, and at least one of a resolution and a pixel arrangement structure of the first component area may be different from that of the second component area.

The first display elements may include a first auxiliary display element and a second auxiliary display element that are in the component area, wherein a thickness of a first pixel electrode of the first auxiliary display element may be greater than a thickness of a second pixel electrode of the second auxiliary display element, and the first pixel electrode may include a reflective layer.

The first display elements may include a first auxiliary display element in the component area, the first auxiliary display element including a pixel electrode including a first pixel electrode portion and a second pixel electrode portion, wherein the first pixel electrode portion and a second pixel electrode portion may have different thicknesses, and wherein the first pixel electrode portion may include a first transparent electrode layer, a reflective layer, and a second transparent electrode layer that are stacked, and the second pixel electrode portion may extend from the first transparent electrode layer.

The second display elements may include inorganic light-emitting diodes, and each of the inorganic light-emitting diodes may be arranged between a first electrode and a second electrode that may be located at different layers.

The second display element may include inorganic light-emitting diodes, and each of the inorganic light-emitting diodes may be arranged between a first electrode and a second electrode that may be located at the same layer.

The component may include a first component and a second component that are configured to perform different functions, and the first component and the second component may be located at the same substrate.

The component may include one or more of an imaging device, an infrared sensor, a solar battery, and/or a flash.

A resolution of the main display area may be greater than a resolution of the component area.

The first display panel may include a substrate and a bottom metal layer, the bottom metal layer being arranged between the substrate and the first display elements, and the bottom metal layer may define a bottom-hole corresponding to at least a portion of the component area.

According to one or more embodiments, a display panel includes a substrate including a main display area and a component area, main display elements arranged in the main display area, and auxiliary display elements arranged in the component area, wherein the auxiliary display elements include first auxiliary display elements and second auxiliary display elements, a thickness of a first pixel electrode of the first auxiliary display elements is greater than a thickness of a second pixel electrode of the second auxiliary display elements, and the first pixel electrode may include a reflective layer.

A pixel arrangement structure of main sub-pixels including the main display elements may be the same as a pixel arrangement structure of auxiliary sub-pixels including the auxiliary display elements.

A first sub-pixel including one or more of the first auxiliary display elements may be smaller than a second sub-pixel comprising one or more of the second auxiliary display elements, and configured to display the same color as the first sub-pixel.

The first auxiliary display elements and the second auxiliary display elements may be provided as one body, the first pixel electrode may include a first transparent electrode layer, a reflective layer, and a second transparent electrode layer, and the second pixel electrode may extend from the first transparent electrode layer.

The display panel may further include a bottom metal layer arranged between the substrate and the first auxiliary display elements, wherein the bottom metal layer may define a bottom-hole corresponding to the second auxiliary display elements.

A resolution of the main display area may be greater than a resolution of the component area.

BRIEF DESCRIPTION OF THE DRAWINGS

The above and other aspects and features of embodiments of the present disclosure will become more apparent from the following description taken in conjunction with the accompanying drawings, in which:

FIGS. 13A and 13B are cross-sectional views of a portions of the display device according to a further embodiment;

DETAILED DESCRIPTION

Figure 1:
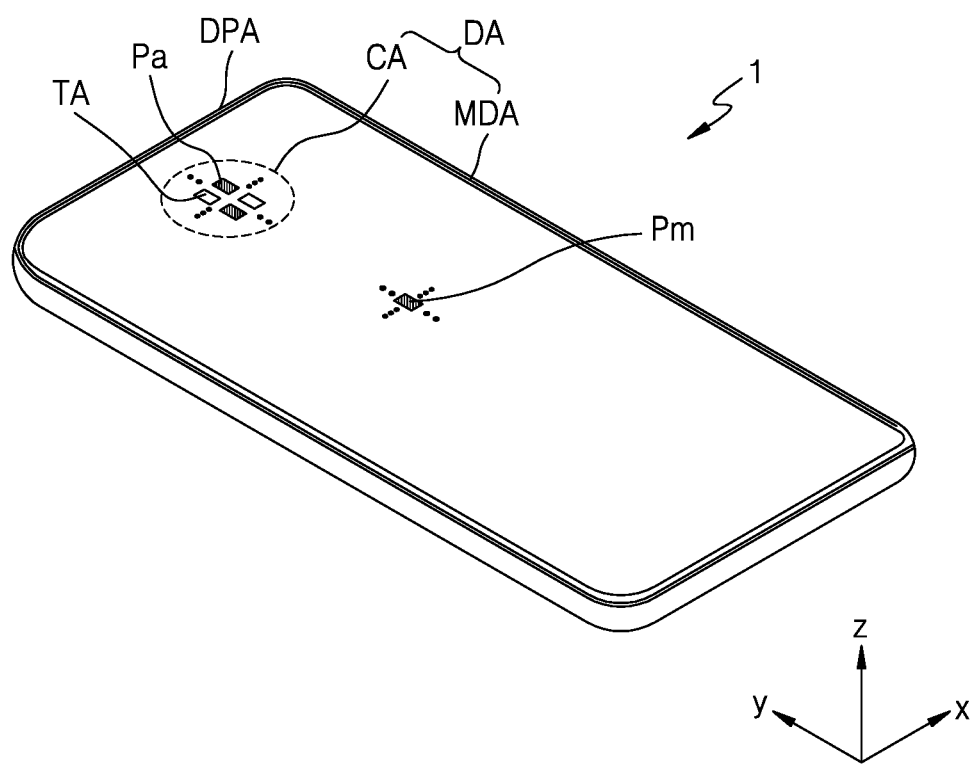
FIG. 1 is a perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in detail with reference to the accompanying drawings. In the drawings, the same reference numerals are given to the same or corresponding elements, and repeated description thereof may be omitted.

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated or reduced for convenience of explanation. In other words, because sizes and thicknesses of components in the drawings are arbitrarily illustrated for convenience of explanation, the following embodiments are not limited thereto.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display device 1 according to an embodiment.

Figure 2:
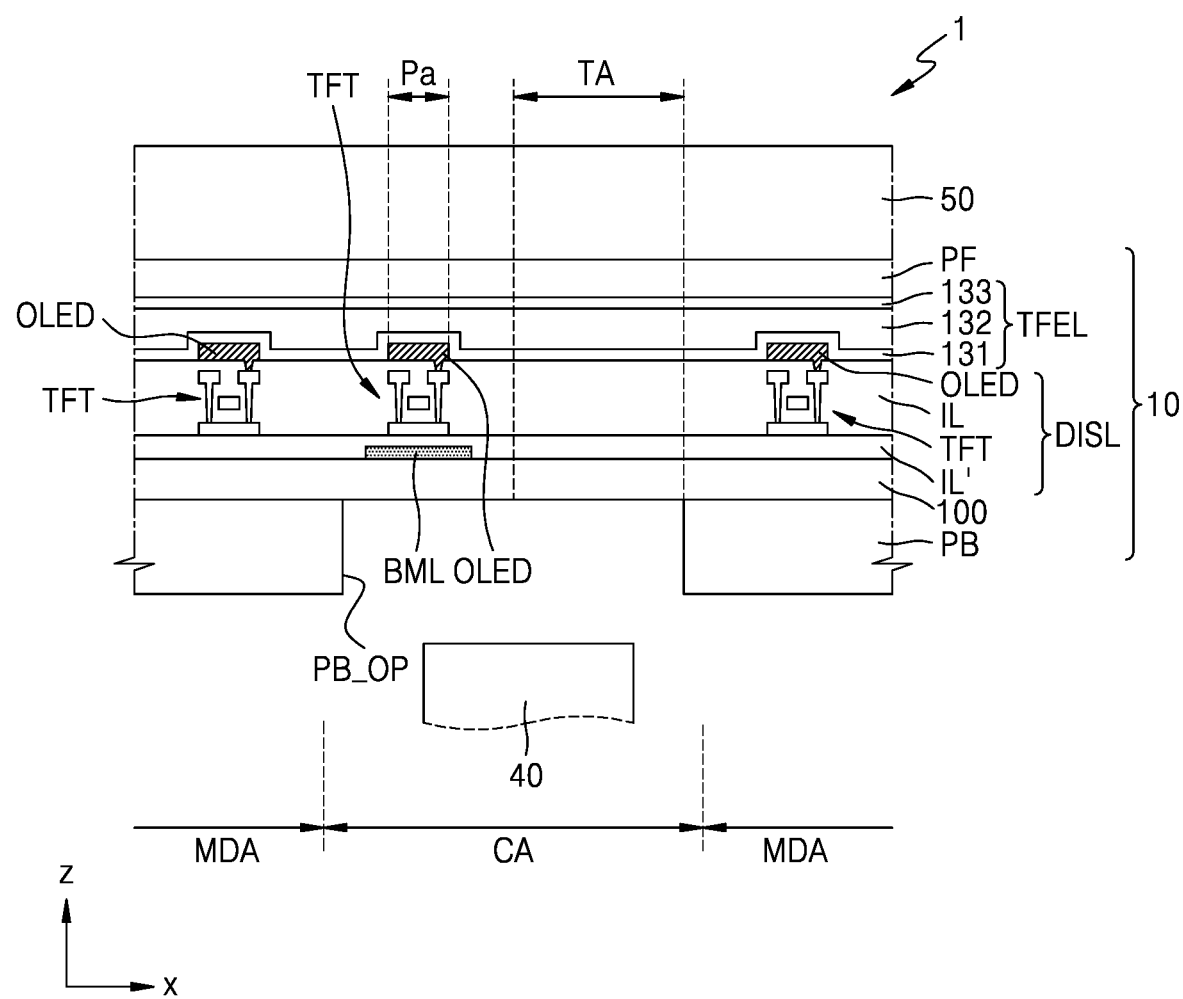
FIG. 2 is a cross-sectional view of a portion of the display device according to an embodiment.

Referring to FIG. 1, the display device 1 includes a display area DA and a peripheral area DPA outside the display area DA. The display area DA includes a component area CA and a main display area MDA that at least partially surrounds the component area CA. That is, the component area CA and the main display area MDA may display an image separately or together. The peripheral area DPA may be a kind of non-display area in which display elements (for example, organic light-emitting diodes OLEDs as shown in FIG. 2) are not arranged. The display area DA may be entirely surrounded by the peripheral area DPA.

It is shown in FIG. 1 that one component area CA is located inside the main display area MDA. In another embodiment, the display device 1 may include two or more component areas CA, and the shapes and the sizes of the plurality of component areas CA may be different from each other. When viewed in a direction approximately perpendicular to a top surface of the display device 1, the component area CA may have various shapes such as a circle, an ellipse, a polygon including a quadrangle, a star shape, and a diamond shape. In addition, though it is shown in FIG. 1 that, when viewed in the direction approximately perpendicular to a top surface of the display device 1, the component area CA is arranged in a top (a +y direction) center of the main display area MDA having an approximately quadrangular shape, the component area CA may be arranged on one side of the main display area MDA, which has a quadrangular shape, for example, a top right side or a top left side of the main display area MDA.

The display device 1 may display an image by using a plurality of main sub-pixels Pm arranged in the main display area MDA and a plurality of auxiliary sub-pixels Pa arranged in the component area CA.

As described below with reference to FIG. 2, a component 40 may be arranged below the component area CA. The component 40 may be a camera that uses infrared or visible light and may include an imaging device. Alternatively, the component 40 may include a solar battery, a flash, an illuminance sensor, a proximity sensor, and/or an iris sensor. Alternatively, the component 40 may include the ability to receive sound. To minimize or reduce functional limitations to the component 40, the component area CA may include a transmission area TA through which light and/or sound that is output from the component 40 to the outside or that progresses toward the component 40 from the outside may pass. According to embodiments, in a display panel and the display device 1 including the display panel, when light is transmitted through the component area CA, a light transmittance thereof may be 10% or more, more preferably, 25% or more, 40% or more, 50% or more, 85% or more, or 90% or more.

A plurality of auxiliary sub-pixels Pa may be arranged in the component areas CA. The plurality of auxiliary sub-pixels Pa may display an image, e.g., a predetermined image, by emitting light. An image displayed in the component area CA is an auxiliary image and may have a resolution less than that of an image displayed in the main display area MDA. That is, the component area CA includes the transmission area TA through which light and sound may pass, and in the case where sub-pixels are not arranged in the transmission area TA, the number of auxiliary sub-pixels Pa that may be arranged per unit area in the component area CA may be less than the number of main sub-pixels Pm arranged per unit area in the main display area MDA.

FIG. 2 is a cross-sectional view of a portion of the display device 1 according to an embodiment.

Referring to FIG. 2, the display device 1 may include a display panel 10, a window 50 on the display panel 10, and the component 40, which is an electronic element corresponding to the component area CA. The display panel 10 may include a display element, and the component 40 may be located below the display panel 10.

The display panel 10 may include a substrate 100, a display layer DISL on the substrate 100, a thin-film encapsulation layer TFEL on the display layer DISL, an optical functional layer PF, and the window 50. The thin-film encapsulation layer TFEL may serve as a sealing member sealing the display layer DISL, In addition, the display panel 10 may further include a panel bottom cover PB and the panel bottom cover PB may be arranged under the substrate 100.

The substrate 100 may include an insulating material such as glass, quartz, and/or a polymer resin. The substrate 100 may be a rigid substrate or a flexible substrate that is bendable, foldable, and/or rollable.

The display layer DISL may include a circuit layer, a display element layer, and insulating layers IL and IL' therebetween, the circuit layer including thin film transistors TFT and TFT' over the substrate 100, the display element layer including an organic light-emitting diode OLED, which is a display element.

A main thin film transistor TFT and an organic light-emitting diode OLED connected thereto may be arranged in the main display area MDA of the display panel 10 to implement a main sub-pixel Pm. An auxiliary thin film transistor TFT' and an auxiliary organic light-emitting diode OLED connected thereto may be arranged in the component area CA of the display panel 10 to implement an auxiliary sub-pixel Pa.

In addition, the transmission area TA may be arranged in the component area CA. The transmission area TA may be a region through which light/sound that is emitted from the component 40 or incident to the component 40 may pass, the component 40 being arranged to correspond to the component area CA.

A bottom metal layer BML may be arranged in the component area CA. The bottom metal layer BML may be arranged below the auxiliary thin film transistor TFT'. The bottom metal layer BML may block external light reaching the auxiliary thin film transistor TFT', etc. For example, the bottom metal layer BML may block light reaching a pixel circuit PC (shown, for example, in FIGS. 4A and 4B) driving an auxiliary pixel Pa, the light being emitted from the component 40. In an embodiment, a constant voltage or a signal may be applied to the bottom metal layer BML to reduce or prevent the damage of the pixel circuit PC by electrostatic discharge.

The thin-film encapsulation layer TFEL may include at least one inorganic encapsulation layer and at least one organic encapsulation layer. With regard to this, FIG. 2 shows first and second inorganic encapsulation layers 131 and 133 and an organic encapsulation layer 132 therebetween.

The first and second inorganic encapsulation layers 131 and 133 may include at least one inorganic insulating material among aluminum oxide, titanium oxide, tantalum oxide, hafnium oxide, silicon oxide, silicon nitride, and silicon oxynitride. The organic encapsulation layer 340 may include a polymer-based material. The polymer-based material may include an acryl-based resin, an epoxy-based resin, polyimide, and polyethylene.

The panel bottom cover PB may be attached on a backside of the substrate 100 to support and protect the substrate 100. The panel bottom cover PB may include an opening PB_OP corresponding to the component area CA. The panel bottom cover PB may improve a light transmittance of the component area CA by including the opening PB_OP. The panel bottom cover PB may include polyethylene terephthalate (PET) or polyimide (PI).

The area of the component area CA may be greater than an area in which the component 40 is arranged. Therefore, the area of the opening PB_OP of the panel bottom cover PB may not coincide with the area of the component 40.

In addition, a plurality of components 40 may be arranged in the component area CA. Functions of the plurality of components 40 may be different from each other. For example, the plurality of components 40 may include at least two of a camera (an imaging device), a solar battery, a flash, a proximity sensor, an illuminance sensor, and an iris sensor.

The optical functional layer PF may include a reflection prevention layer. The reflection prevention layer may reduce reflectivity of light (external light) incident to (or on) the display device 1 from the outside.

In an embodiment, the reflection prevention layer may include an optical plate including a retarder and/or a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. In an embodiment, the reflection prevention layer may include a black matrix and color filters.

The window 50 may be arranged on a top surface of the display panel 10 to cover the top surface of the display panel 10. Therefore, the window 50 may protect the top surface of the display panel 10.

In some embodiments, a touch electrode layer may be further arranged between the thin film encapsulation layer TFEL and the optical functional layer PF, the touch electrode layer sensing a touch input. Though it is shown in the present embodiment that the thin-film encapsulation layer TFEL is used as a sealing member, the embodiment is not limited thereto. For example, a sealing substrate that is attached to the substrate by using sealant or frit may be used as a member to seal the display layer DISL.

Figure 3:
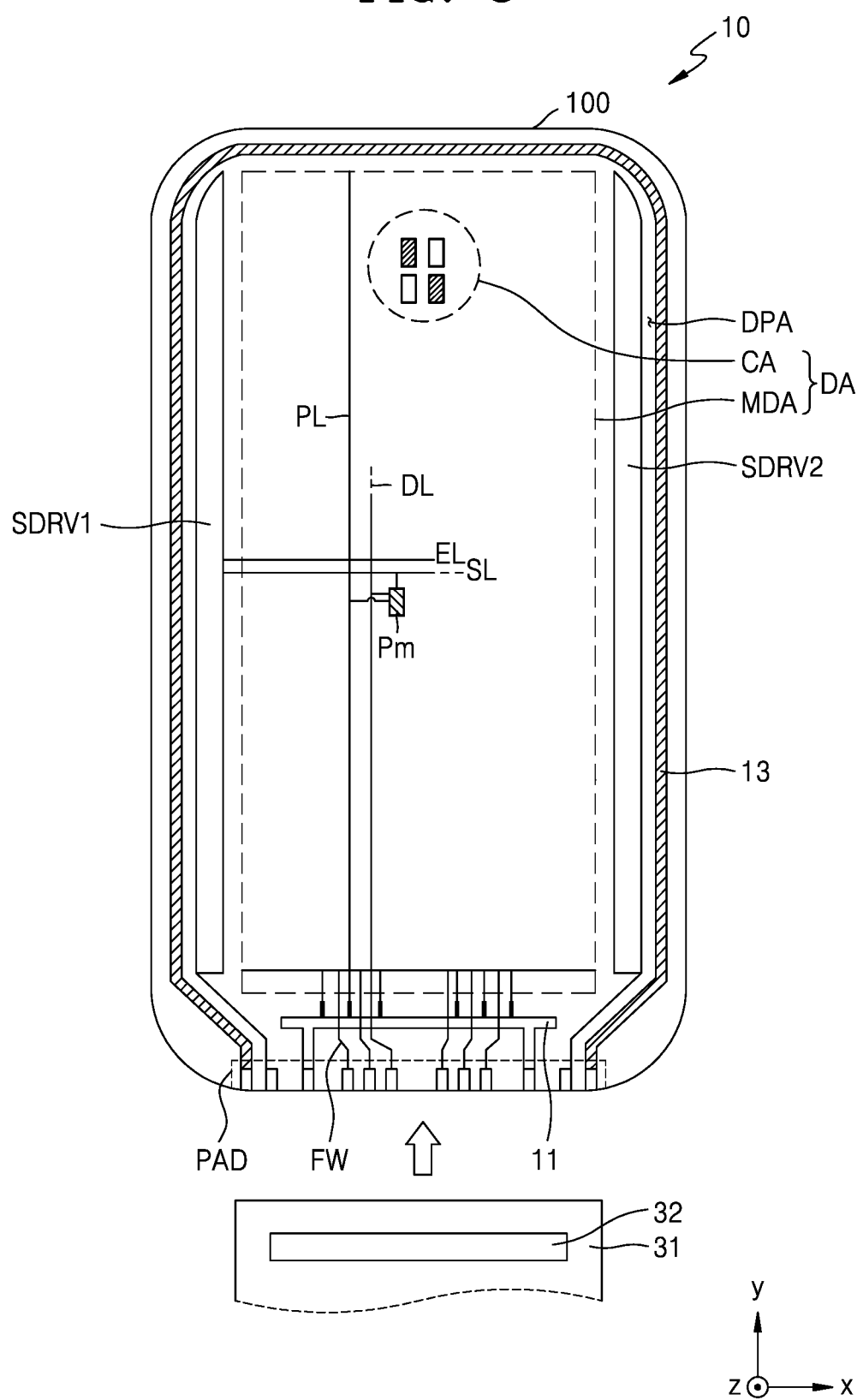
FIG. 3 is a plan view of a display panel that may be included in the display device of FIG. 1.

FIG. 3 is a plan view of the display panel 10 that may be included in the display device of FIG. 1. In example embodiments, the plan view is an orthographic projection looking down at the display device 1.

Referring to FIG. 3, various kinds of elements constituting the display panel 10 are arranged on the substrate 100. The substrate 100 includes the display area DA and the peripheral area DPA surrounding the display area DA. The display area DA includes the main display area MDA and the component area CA, the main display area MDA displaying a main image, and the component area CA including the transmission area TA and displaying an auxiliary image. An auxiliary image may constitute one entire image in cooperation with a main image, or may be an image independent of the main image.

A plurality of main sub-pixels Pm are arranged in the main display area MDA. Each of the main sub-pixels Pm may be implemented by using a display element such as an organic light-emitting diode OLED. Each main sub-pixel Pm may be defined as an emission area of an organic light-emitting diode OLED arranged in the main display area MDA and may emit red, green, blue, or white light. The main display area MDA may be covered by a sealing member and protected from external air or moisture, etc.

The component area CA may be located on one side of the main display area MDA. A plurality of auxiliary sub-pixels Pa are arranged in the component area CA. Each of the plurality of auxiliary sub-pixels Pa may be implemented by using a display element, such as an organic light-emitting diode OLED. Each auxiliary sub-pixel Pa may be defined as an emission area of an organic light-emitting diode OLED arranged in the component area CA and may emit red, green, blue, or white light. The component area CA may be covered by a sealing member and protected from external air or moisture, etc.

The component area CA may include the transmission area TA. The transmission area TA may surround a plurality of auxiliary sub-pixels Pa. Alternatively, the transmission area TA and pixel groups may be arranged in a lattice configuration, the pixel groups including pixels from the plurality of auxiliary sub-pixels Pa.

Because the component area CA includes the transmission area TA, the resolution of the component area CA may be less than the resolution of the main display area MDA. For example, the resolution of the component area CA may be $1/2$, $3/8$, $1/3$, $1/4$, $2/9$, $1/8$, $1/9$, or $1/16$ of the resolution of the main display area MDA. For example, the resolution of the main display area MDA may be 400 ppi or more, and the resolution of the component area CA may be 200 ppi or more or about 100 ppi.

Pixel circuits PC (shown, for example, in FIGS. 4A and 4B) driving sub-pixels, that is, main sub-pixels Pm and auxiliary sub-pixels Pa, may be electrically connected to outer circuits arranged in the peripheral area DPA. A first scan driving circuit SDRV1, a second scan driving circuit SDRV2, a terminal unit PAD, a driving voltage supply line 11, and a common voltage supply line 13 may be arranged in the peripheral area DPA.

The first scan driving circuit SDRV1 may apply a scan signal to each of the pixel circuits PC through a scan line SL, the pixel circuits PC driving sub-pixels, that is, main sub-pixels Pm and auxiliary sub-pixels Pa. The first scan driving circuit SDRV1 may apply an emission control signal to each pixel circuit PC through an emission control line EL. The second scan driving circuit SDRV2 may be located on the opposite side of the first scan driving circuit SDRV1 with the main display area MDA therebetween. The second scan driving circuit SDRV2 may be approximately parallel to the first scan driving circuit SDRV1. Some of the pixel circuits PC of the main sub-pixels Pm in the main display area MDA may be electrically connected to the first scan driving circuit SDRV1, and the rest of the pixel circuits PC of the main sub-pixels Pm in the main display area MDA may be electrically connected to the second scan driving circuit SDRV2. Some of the pixel circuits PC of the auxiliary sub-pixels Pa in the component area CA may be electrically connected to the first scan driving circuit SDRV1, and the rest of the pixel circuits PC of the auxiliary sub-pixels Pa in the component area CA may be electrically connected to the second scan driving circuit SDRV2. In some embodiments, the second scan driving circuit SDRV2 may be omitted.

The terminal unit PAD may be arranged on one side of the substrate 100. The terminal unit PAD is exposed without being covered by an insulating layer and is connected to a display circuit board 31. A display driver 32 may be arranged on the display circuit board 31. The display driver 32 may generate a control signal transferred to the first scan driving circuit SDRV1 and the second scan driving circuit SDRV2. In addition, the display driver 32 may supply a driving voltage ELVDD to the driving voltage supply line 11, and supply a common voltage ELVSS to the common voltage supply line 13, as shown, for example, in FIGS. 4A and 4B. The driving voltage ELVDD may be applied to the pixel circuits PC of the sub-pixels, that is, main sub-pixels Pm and auxiliary sub-pixels Pa through a driving voltage line PL connected to the driving voltage supply line 11, and the common voltage ELVSS may be connected to the common voltage supply line 13 and applied to an opposite electrode of a display element, e.g., the organic light-emitting diode OLED. The display driver 32 generates a data signal, and the generated data signal may be transferred to the pixel circuits PC of the sub-pixels, that is, main sub-pixels Pm and auxiliary sub-pixels Pa through a fan-out wiring FW and a data line DL connected to the fan-out wiring FW.

The driving voltage supply line 11 may extend in an x-direction below the main display area MDA. The common voltage supply line 13 may have a loop shape having one open side and partially surround the main display area MDA.

Figure 4A:
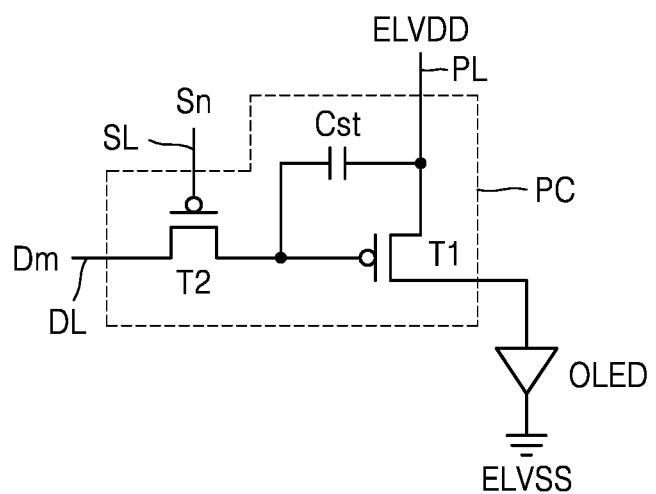
FIGS. 4A and 4B are views of pixel circuits according to embodiments of the present disclosure.
Figure 4B:
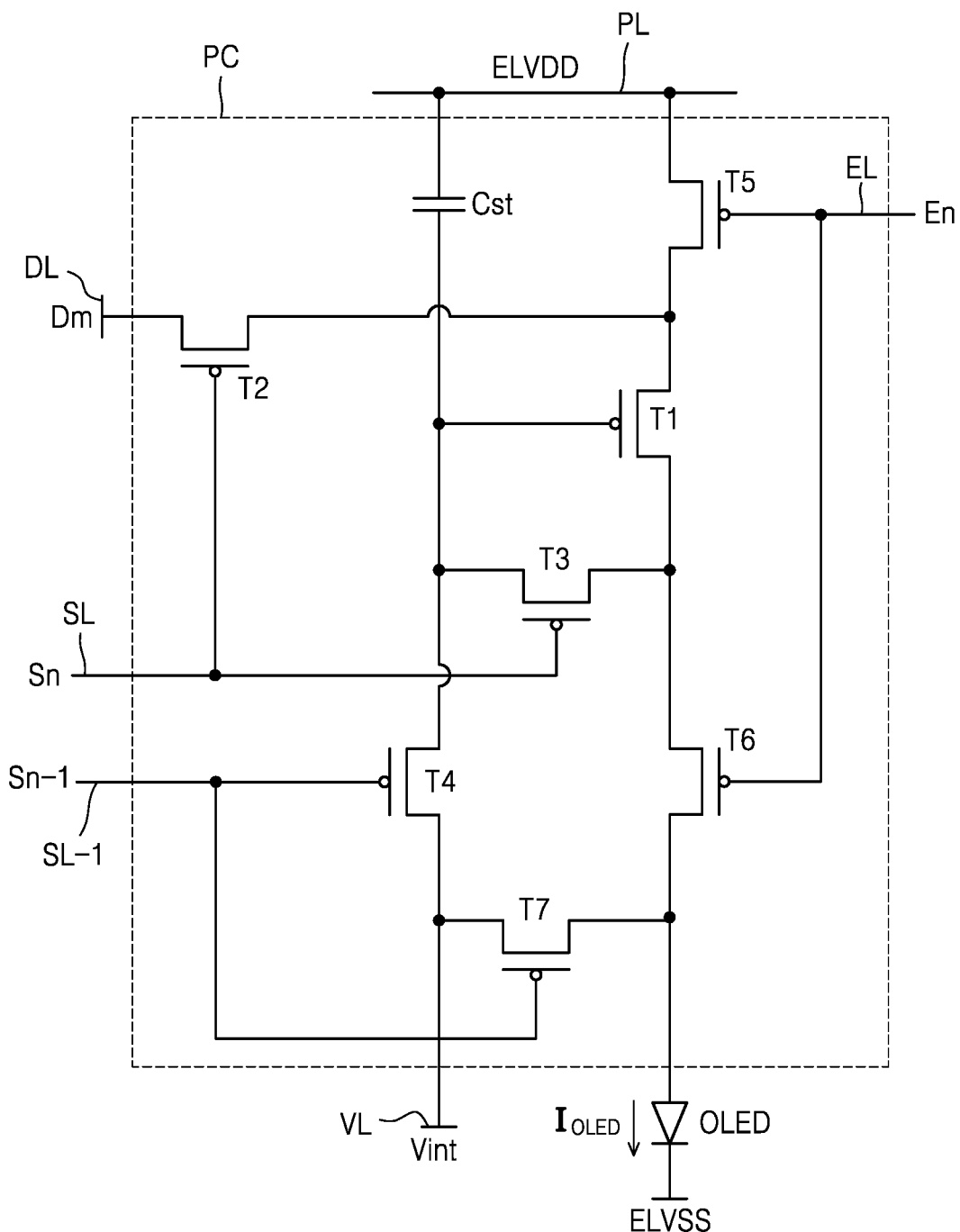

FIGS. 4A and 4B are views of embodiments of pixel circuits PC driving the sub-pixels, that is, main sub-pixels Pm and auxiliary sub-pixels Pa according to embodiments of the present disclosure.

Referring to FIG. 4A, the pixel circuit PC may be connected to an organic light-emitting diode OLED and may implement light emission of the sub-pixels. The pixel circuit PC includes a driving thin film transistor T1, a switching thin film transistor T2, and a storage capacitor Cst. The switching thin film transistor T2 is connected to a scan line SL and a data line DL and transfers a data signal Dm input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the driving voltage ELVDD supplied to the driving voltage line PL.

The driving thin film transistor T1 is connected to the driving voltage line PL and the storage capacitor Cst and may control a driving current flowing through the organic light-emitting diode OLED from the driving voltage line PL in response to the voltage stored in the capacitor Cst. The organic light-emitting diode OLED may emit light having a predetermined brightness by using the driving current.

Though FIG. 4A describes the case where the pixel circuit PC includes two thin film transistors and one storage capacitor, the present disclosure is not limited thereto.

Referring to the embodiment of FIG. 4B, the pixel circuit PC may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

Though FIG. 4B shows the case where each pixel circuit PC includes signal lines SL, SL-1, EL, and DL, an initialization voltage line VL, and the driving voltage line PL, the present disclosure is not limited thereto. In another embodiment, at least one of the signal lines SL, SL-1, EL, and DL, and/or the initialization voltage line VL may be shared by pixels that neighbor each other.

A drain electrode of the driving thin film transistor T1 may be electrically connected to the organic light-emitting diode OLED through the emission control thin film transistor T6. The driving thin film transistor T1 receives a data signal Dm in response to a switching operation of the switching thin film transistor T2 and supplies the driving current to the organic light-emitting diode OLED.

A gate electrode of the switching thin film transistor T2 is connected to the scan line SL, and a source electrode of the switching thin film transistor T2 is connected to the data line DL. A drain electrode of the switching thin film transistor T2 may be connected to a source electrode of the driving thin film transistor T1 and connected to the driving voltage line PL through the operation control thin film transistor T5.

The switching thin film transistor T2 is turned on in response to a scan signal transferred through the scan line SL and performs a switching operation t transfer a data signal Dm transferred through the data line DL to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1 and connected to a pixel electrode of the organic light-emitting diode OLED through the emission control thin film transistor T6. The drain electrode of the compensation thin film transistor T3 may be connected to one of electrodes of the storage capacitor Cst, a source electrode of the first initialization thin film transistor T4, and the gate electrode of the driving thin film transistor T1. The compensation thin film transistor T3 is turned on in response to a scan signal Sn transferred through the scan line SL and diode-connects the driving thin film transistor T1 by connecting the gate electrode of the driving thin film transistor T1 to the drain electrode of the driving thin film transistor T1.

A gate electrode of the first initialization thin film transistor T4 may be connected to the previous scan line SL-1. A drain electrode of the first initialization thin film transistor T4 may be connected to the initialization voltage line VL. The source electrode of the first initialization thin film transistor T4 may be connected to one of the electrodes of the storage capacitor Cst, the drain electrode of the compensation thin film transistor T3, and the gate electrode of the driving thin film transistor T1. The first initialization thin film transistor T4 is turned on in response to a previous scan signal Sn-1 transferred through the previous scan line SL-1 and may perform an initialization operation of initializing a voltage of the gate electrode of the driving thin film transistor T1 by transferring an initialization voltage Vint to the gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 are simultaneously turned on in response to an emission control signal En transferred through the emission control line EL, the driving voltage ELVDD is transferred to the organic light-emitting diode OLED, and the driving current flows through the organic light-emitting diode OLED.

A gate electrode of the second initialization thin film transistor T7 may be connected to the previous scan line SL-1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin film transistor T7 may be turned on in response to a previous scan signal Sn-1 transferred through the previous scan line SL-1 and may initialize the pixel electrode of the organic light-emitting diode OLED.

Though FIG. 4B shows the case where the first initialization thin film transistor T4 and the second initialization thin film transistor T7 are connected to the previous scan line SL-1, the present disclosure is not limited thereto. In some embodiments, the first initialization thin film transistor T4 may be connected to the previous scan line SL-1 and driven in response to a previous scan signal Sn-1, and the second initialization thin film transistor T7 may be connected to a separate signal line (for example, the next scan line SL) and driven in response to a signal transferred through the separate signal line.

The other of the electrodes of the storage capacitor Cst may be connected to the driving voltage line PL. One of the electrodes of the storage capacitor Cst may be connected to the gate electrode of the driving thin film transistor T1, the drain electrode of the compensation thin film transistor T3, and the source electrode of the first initialization thin film transistor T4.

The opposite electrode (e.g. a cathode) of the organic light-emitting diode OLED receives the common voltage ELVSS. The organic light-emitting diode OLED emits light by receiving the driving current from the driving thin film transistor T1.

The number of thin film transistors, the number of storage capacitors, and a circuit design are not limited to the pixel circuits PC described with reference to FIGS. 4A and 4B, and may be modified into other various suitable forms as understood by a person of ordinary skill in the art.

The same pixel circuit PC or different pixel circuits PC may be applied to the main sub-pixels Pm and the auxiliary sub-pixels Pa, the pixel circuits PC driving the main sub-pixels Pm and the auxiliary sub-pixels Pa. For example, the pixel circuits PC driving the main sub-pixels Pm and the auxiliary sub-pixels Pa may include the pixel circuit PC shown in FIG. 4B. In other embodiments, the pixel circuit PC shown in FIG. 4B may be employed as the pixel circuits PC driving the main sub-pixels Pm, and the pixel circuit PC shown in FIG. 4A may be employed as the pixel circuits PC driving the auxiliary sub-pixels Pa.

Figure 5:
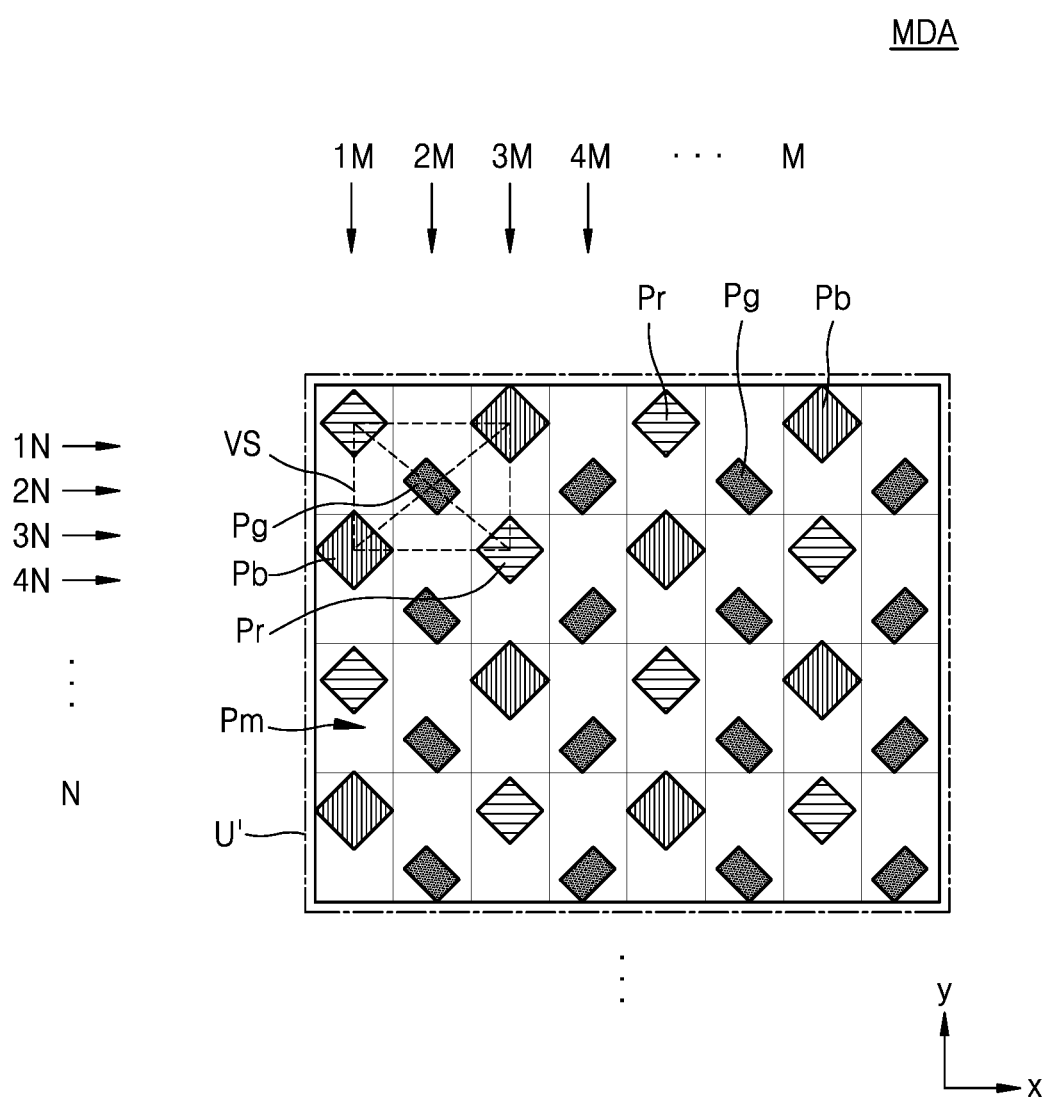
FIG. 5 is a plan view of a pixel arrangement structure applicable to a main display area of the display panel according to an embodiment.

FIG. 5 is a plan view of a pixel arrangement structure applicable to the main display area MDA of the display panel according to an embodiment.

A plurality of main sub-pixels Pm may be arranged in the main display area MDA. In the present specification, a sub-pixel is a minimum unit for implementing an image and refers to an emission area. In the case where the organic light-emitting diode OLED is employed as a display element, the emission area may be defined by an opening of a pixel-defining layer.

As shown in FIG. 5, the main sub-pixels Pm arranged in the main display area MDA may be arranged in a PenTile® structure. PenTile® is a registered trademark of Samsung Display Co., Ltd. A red sub-pixel Pr, a green sub-pixel Pg, and a blue sub-pixel Pb may respectively emit red, green, and blue light.

A plurality of red sub-pixels Pr and a plurality of blue sub-pixels Pb are alternately arranged on a first row 1N, a plurality of green sub-pixels Pg are apart from each other with a predetermined interval on a neighboring second row 2N, a plurality of blue sub-pixels Pb and a plurality of red sub-pixels Pr are alternately arranged on a neighboring third row 3N, and a plurality of green sub-pixels Pg are apart from each other with a predetermined interval on a neighboring fourth row 4N. This pixel arrangement is repeated up to an N-th row. In this case, the blue sub-pixel Pb and the red sub-pixel Pr may be larger than the green sub-pixel Pg.

The plurality of red sub-pixels Pr and the plurality of blue sub-pixels Pb on the first row 1N and the plurality of green sub-pixels Pg on the second row 2N may be alternately arranged. Therefore, the plurality of red sub-pixels Pr and the plurality of blue sub-pixels Pb are alternately arranged on a first column 1M, the plurality of green sub-pixels Pg are apart from each other with a predetermined interval on a neighboring second column 2M, the plurality of blue sub-pixels Pb and the plurality of red sub-pixels Pr are alternately arranged on a neighboring third column 3M, and the plurality of green sub-pixels Pg are apart from each other with a predetermined interval on a neighboring fourth column 4M. This pixel arrangement is repeated up to an M-th column.

When the pixel arrangement structure is expressed differently, in a virtual quadrangle VS having a central point of the green sub-pixel Pg at its central point, the red sub-pixels Pr are arranged at first and third vertexes of the virtual quadrangle VS facing each other, and the blue sub-pixels Pb are arranged at second and fourth vertexes, which are the rest of the vertexes. In this case, the virtual quadrangle VS may include a rectangle, a rhombus, a square, etc. and may be modified variously.

This pixel arrangement structure is referred to herein as a PenTile® matrix structure or a PenTile® structure, and a high resolution may be implemented with a small number of pixels by employing rendering driving that expresses a color by sharing neighboring pixels.

Though it is shown in FIG. 5 that a plurality of main sub-pixels Pm are arranged in a PenTile® matrix structure, the embodiment is not limited thereto. For example, the plurality of main sub-pixels Pm may be arranged in various structures such as a stripe structure, a mosaic structure, a delta arrangement structure, etc.

FIGS. 6A to 6D are plan views of pixel arrangement structures in the component area CA according to various embodiments.

Figure 6A:
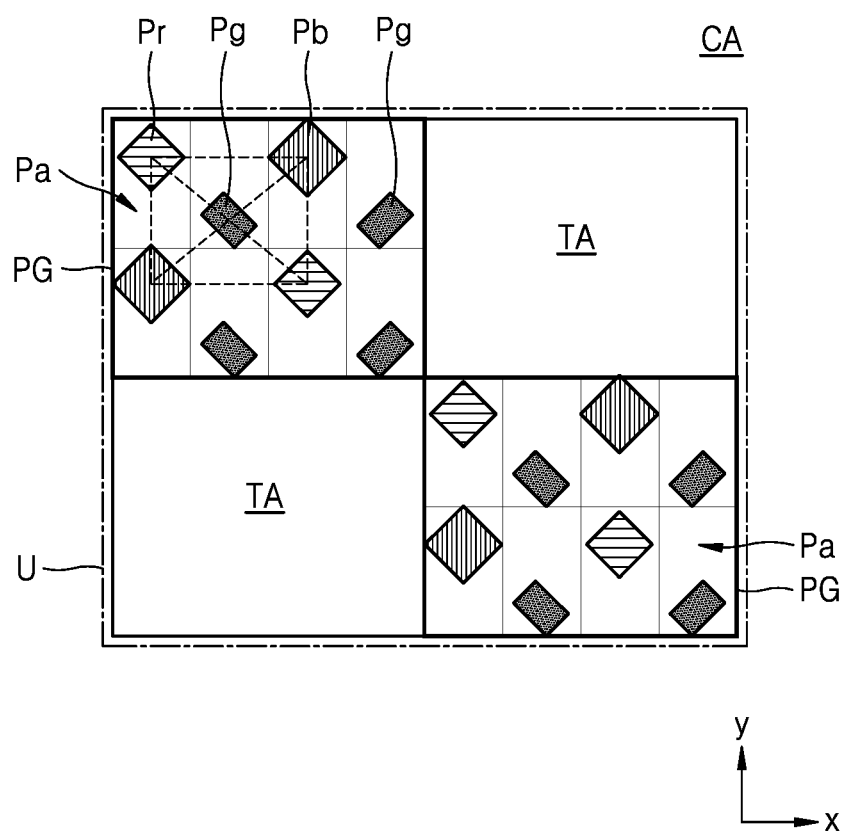
FIGS. 6A to 6D are plan views of pixel arrangement structures applicable to a component area of the display panel according to various embodiments.

Referring to FIG. 6A, a plurality of auxiliary sub-pixels Pa may be arranged in the component area CA as shown. Each of the plurality of auxiliary sub-pixels Pa may emit red, green, blue, or white light.

The component area CA may include a pixel group PG and the transmission area TA, the pixel group PG including at least one auxiliary sub-pixel Pa. The pixel group PG and the transmission area TA may be alternately arranged in an x-direction and a y-direction, for example, in a lattice configuration. In the embodiment shown in FIG. 6A, the component area CA includes a plurality of pixel groups PG and a plurality of transmission areas TA.

The pixel group PG may be defined as a sub-pixel assembly in which a plurality of auxiliary sub-pixels Pa are grouped in a predetermined unit. For example, it is shown in FIG. 6A that one pixel group PG includes eight auxiliary sub-pixels Pa. That is, it is shown in FIG. 6A that one pixel group PG includes two red sub-pixels Pr, four green sub-pixels Pg, and two blue sub-pixels Pb. In addition, it is shown that the auxiliary sub-pixels Pa are arranged in the PenTile® structure.

A basic unit U may be repeatedly arranged in the x-direction and the y-direction in the component area CA, a predetermined number of pixel groups PG and a predetermined number of transmission areas TA being grouped in the basic unit U. In FIG. 6A, the basic unit U may have a configuration in which two pixel groups PG and two transmission areas TA around the two pixel groups PG are grouped in a quadrangle. The basic unit U partitions a repetitive shape and does not mean disconnection of the configuration.

A corresponding unit U', as shown, for example, in FIG. 5, may be set in the main display area MDA, the corresponding unit U' having the same area as that of the basic unit U. In this case, the number of main sub-pixels Pm included in the corresponding unit U' may be greater than the number of auxiliary sub-pixels Pa included in the basic unit U. That is, in one embodiment, the number of auxiliary sub-pixels Pa included in the basic unit U may be 16, and the number of main sub-pixels Pm included in the corresponding unit U' may be 32. The number of auxiliary sub-pixels Pa and the number of main sub-pixels Pm per same area may be provided at a ratio of 1:2.

A pixel arrangement structure of the component area CA in which an arrangement structure of auxiliary sub-pixels Pa is a PenTile® structure and a resolution of the component area CA is ½ of the resolution of the main display area MDA, as shown in FIG. 6A, is referred to herein as a ½ PenTile® structure.

Figure 6B:
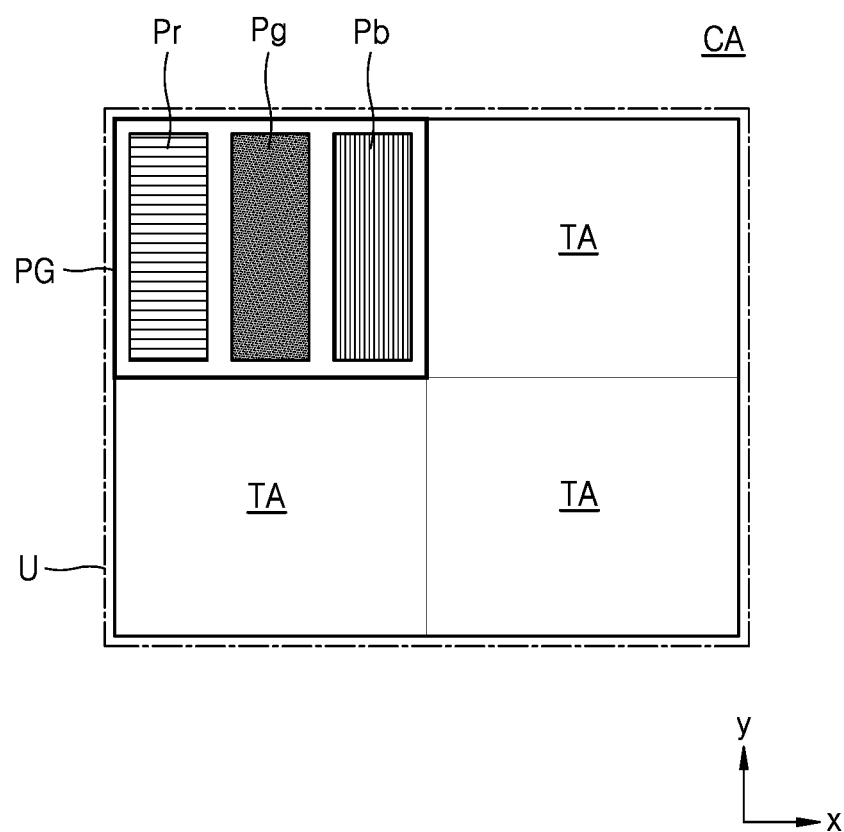

Referring to FIG. 6B, a pixel arrangement structure of auxiliary sub-pixels Pa in the component area CA may be a stripe structure. That is, a red sub-pixel Pr, a green sub-pixel Pg, and a blue sub-pixel Pb may be arranged in parallel in the x-direction. In this case, the red sub-pixel Pr, the green sub-pixel Pg, and the blue sub-pixel Pb may each have a long side in the y-direction. In other embodiments, unlike FIG. 6B, the red sub-pixel Pr, the green sub-pixel Pg, and the blue sub-pixel Pb may be arranged in parallel in the y-direction. In such cases, the red sub-pixel Pr, the green sub-pixel Pg, and the blue sub-pixel Pb may each have a long side in the x-direction.

As shown in FIG. 6B, the shape and the size of the auxiliary sub-pixel Pa may be different from the shape and the size of the main sub-pixel Pm. For example, the size of the red sub-pixel Pr in the auxiliary sub-pixel Pa may be greater than the size of the red sub-pixel Pr in the main sub-pixel Pm. In addition, an area occupied by the pixel group PG in the basic unit U may be ¼, and the rest of regions may be provided as transmission areas TA.

The number of auxiliary sub-pixels Pa or the arrangement of the auxiliary sub-pixels Pa included in the pixel group PG may be changed depending on the desired resolution of the component area CA. For example, the auxiliary sub-pixels Pa may be arranged in a stripe structure, a mosaic structure, a delta structure, etc., and the resolution of the component area CA may be ⅓, ¼, 2/9, ⅛, 1/9, 1/16, etc.

Figure 6C:
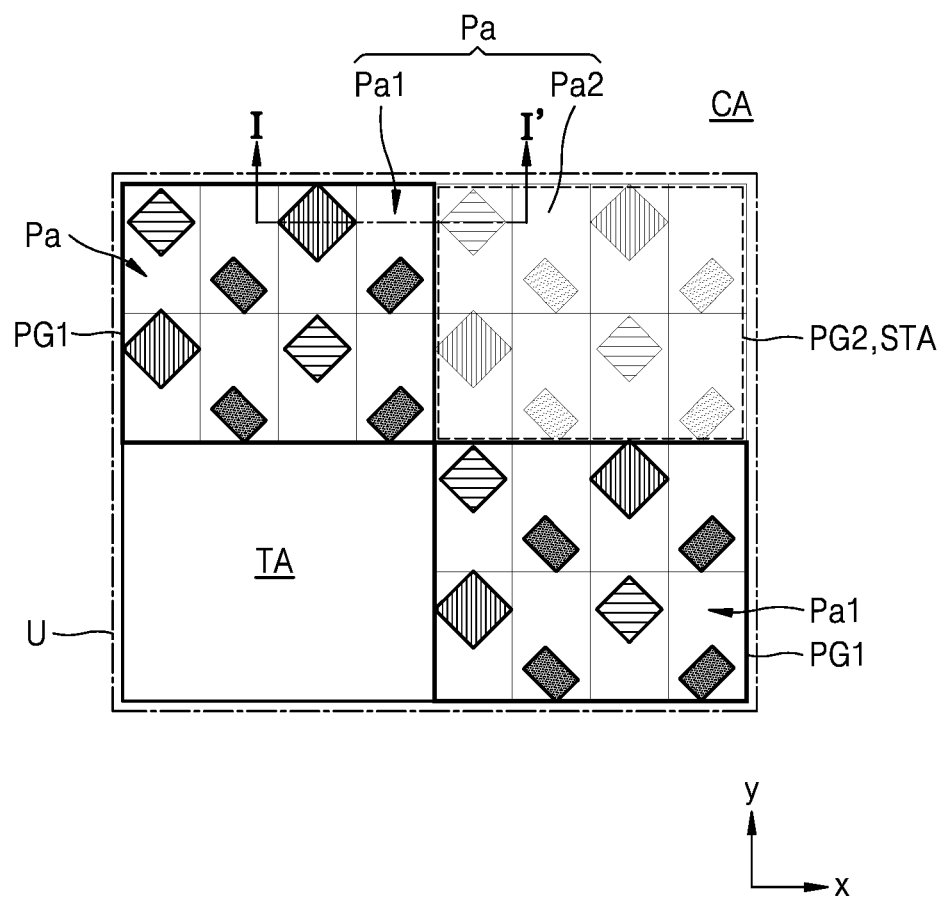

Referring to FIG. 6C, the auxiliary sub-pixels Pa arranged in the component area CA may include a first auxiliary sub-pixel Pa1 and a second auxiliary sub-pixel Pa2 that are implemented by display elements having different light transmittances. For example, a pixel electrode of a display element implementing the first auxiliary sub-pixel Pa1 may include a reflective layer, and a pixel electrode of a display element implementing the second auxiliary sub-pixel Pa2 may include a transparent electrode. Therefore, a region in which a second pixel group PG2 including second auxiliary sub-pixels Pa2 is arranged may be a semi-transmission area STA that partially transmits light. That is, the semi-transmission area STA may be defined as a region having a light transmittance higher than a region in which a first pixel group PG1 including first auxiliary sub-pixels Pa1 is arranged and having a light transmittance lower than the transmission area TA in which auxiliary sub-pixels are not arranged. Because the second pixel group PG2 is arranged, a light transmittance of the component area CA may be secured, and at the same time, the resolution of the component area CA may be increased.

Though it is shown in FIG. 6C that the transmission area TA is arranged in the component area CA, in embodiments in which the semi-transmission area STA is arranged, the transmission area TA may not be provided. The shape and the pixel arrangement structure of the second auxiliary sub-pixels Pa2 arranged in the semi-transmission area STA may be variously changed. For example, the first auxiliary sub-pixels Pa1 may be arranged in the PenTile® structure, and the second auxiliary sub-pixels Pa2 may be arranged in a stripe structure.

Figure 6D:
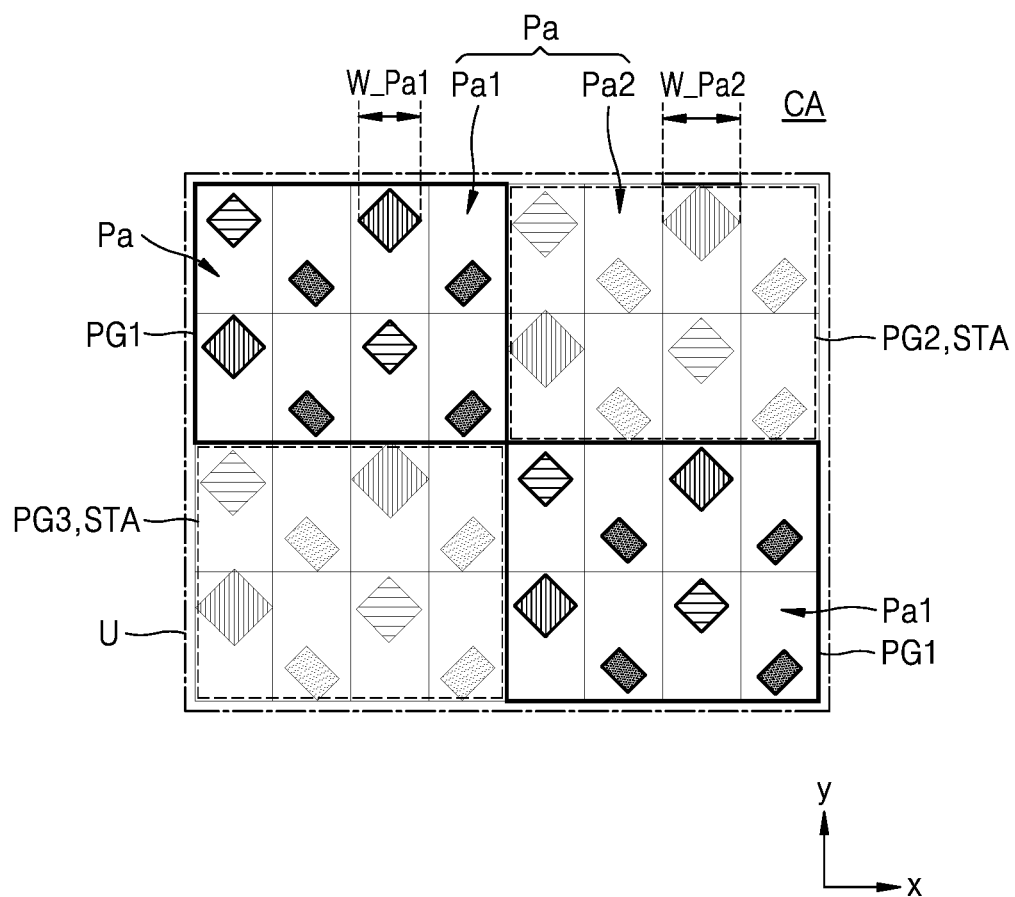

Referring to FIG. 6D, the auxiliary sub-pixels Pa arranged in the component area CA may include the first auxiliary sub-pixel Pa1 and the second auxiliary sub-pixel Pa2 that are implemented by display elements having different light transmittances. For example, a pixel electrode of a display element implementing the first auxiliary sub-pixel Pa1 may include a reflective layer, and a pixel electrode of a display element implementing the second auxiliary sub-pixel Pa2 may include a transparent electrode. In this embodiment, a size W Pa1 of the first auxiliary sub-pixel Pa1 may be less than a size W_Pa2 of the second auxiliary sub-pixel Pa2 producing the same color. Under the same conditions, the brightness of the second auxiliary sub-pixel Pa2 may be less than the brightness of the first auxiliary sub-pixel Pa1, and the brightness of the first auxiliary sub-pixel Pa1 may be adjusted by reducing the size of the first auxiliary sub-pixel Pa1.

Figure 7:
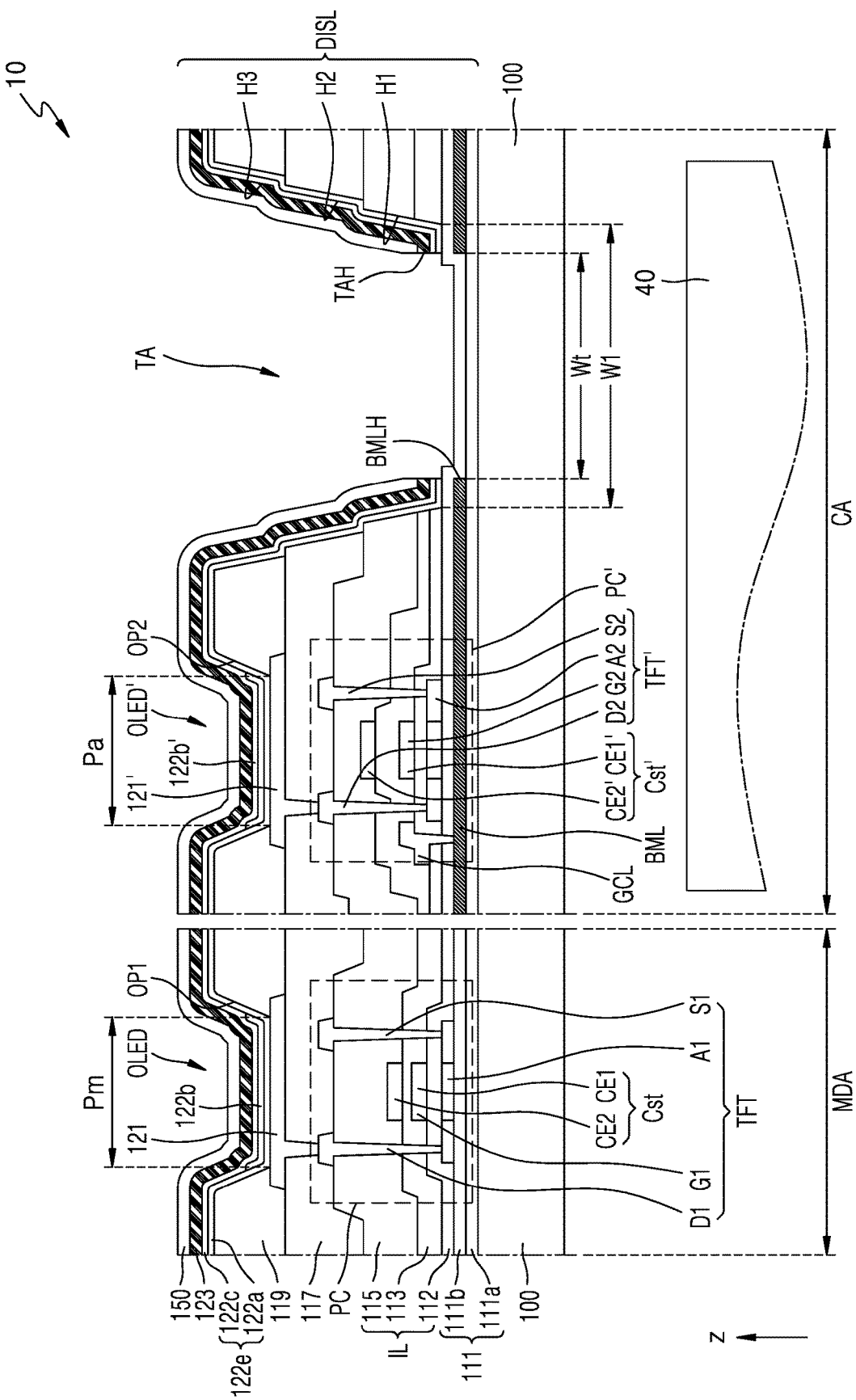
FIG. 7 is a cross-sectional view of a portion of the display panel according to an embodiment.

FIG. 7 is a cross-sectional view of the display panel 10 according to an embodiment, including a cross-sectional view of the main display area MDA and the component area CA.

Referring to FIG. 7, the display panel 10 includes the main display area MDA and the component area CA. The main sub-pixel Pm is arranged in the main display area MDA, and the auxiliary sub-pixel Pa and the transmission area TA are arranged in the component area CA.

The main display area MDA may include the main thin film transistor TFT and the main storage capacitor Cst, that are included in a main pixel circuit PC, and the organic light-emitting diode OLED arranged as a main display element. The component area CA may include the auxiliary thin film transistor TFT' and an auxiliary storage capacitor Cst', that are included in an auxiliary pixel circuit PC and an organic light-emitting diode OLED' arranged as an auxiliary display element. The display panel 10 may include a transmission hole TAH corresponding to the transmission area TA.

Hereinafter, a structure in which elements included in the display panel 10 are stacked is described.

As described above, the substrate 100 may include an insulating material such as glass, quartz, and a polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 may be a rigid substrate or a flexible substrate that is bendable, foldable, and/or rollable. The substrate 100 may have a multi-layered structure including a layer including the polymer resin, and an inorganic layer.

A buffer layer 111 may be located on the substrate 100, reduce or block the penetration of foreign substances, moisture, or external air from below the substrate 100, and may provide a flat surface on the substrate 100. The buffer layer 111 may include an inorganic material such as an oxide or a nitride, an organic material, or an organic/inorganic composite material and include a single layer or a multi-layer including an inorganic material and an organic material. A barrier layer may be further arranged between the substrate 100 and the buffer layer 111, the barrier layer blocking the penetration of external air. In some embodiments, the buffer layer 111 may include silicon oxide ($SiO_2$) or silicon nitride ($SiN_x$). The buffer layer 111 may include a first buffer layer 111a and a second buffer layer 111b that are stacked.

The bottom metal layer BML may be arranged between the first buffer layer 111a and the second buffer layer 111b in the component area CA. In other embodiments, the bottom metal layer BML may be arranged between the substrate 100 and the first buffer layer 111a. The bottom metal layer BML may be arranged below the auxiliary thin film transistor TFT' to reduce or prevent the auxiliary thin film transistor TFT' from being deteriorated by light emitted from a component, etc.

In addition, the bottom metal layer BML may be connected through a contact hole to a line GCL arranged on a different layer. The bottom metal layer BML may receive a constant voltage or a signal from the line GCL. For example, the bottom metal layer BML may receive the driving voltage ELVDD or a scan signal (for example, scan signal Sn). Because the bottom metal layer BML receives a constant voltage or a signal, a probability that electrostatic discharge occurs may be remarkably reduced. The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML may include a single layer or a multi-layer including the above materials.

In some embodiments, the bottom metal layer BML may correspond to the component area CA. In such cases, the bottom metal layer BML may include a bottom-hole BMLH overlapping the transmission area TA. In some embodiments, the shape and the size of the transmission area TA may be defined by the shape and the size of the bottom-hole BMLH.

The main thin film transistor TFT and the auxiliary thin film transistor TFT' may be arranged on the buffer layer 111. The main thin film transistor TFT may include a first semiconductor layer A1, a first gate electrode G1, a first source electrode S1, and a first drain electrode D1, and the auxiliary thin film transistor TFT' may include a second semiconductor layer A2, a second gate electrode G2, a second source electrode S2, a second drain electrode D2. The main thin film transistor TFT may be connected to the organic light-emitting diode OLED of the main display area MDA to drive the organic light-emitting diode OLED. The auxiliary thin film transistor TFT' may be connected to the organic light-emitting diode OLED' of the component area CA to drive the organic light-emitting diode OLED'.

The first semiconductor layer A1 and the second semiconductor layer A2 may be arranged on the buffer layer 111 and may include polycrystalline silicon. In other embodiments, the first semiconductor layer A1 and the second semiconductor layer A2 may include amorphous silicon. In other embodiments, the first semiconductor layer A1 and the second semiconductor layer A2 may include an oxide semiconductor including an oxide of at least one of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 and the second semiconductor layer A2 may include a channel region, a source region, and a drain region, the source region and the drain region being doped with impurities.

The second semiconductor layer A2 may overlap the bottom metal layer BML with the second buffer layer 111b therebetween. In some embodiments, the width of the second semiconductor layer A2 may be less than a width of the bottom metal layer BML. Therefore, when viewed in a direction perpendicular to the substrate 100, the second semiconductor layer A2 may entirely overlap the bottom metal layer BML.

A first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may include a single layer or a multi-layer including the inorganic insulating material.

The first gate electrode G1 and the second gate electrode G2 are arranged on the first gate insulating layer 112 to overlap the first semiconductor layer A1 and the second semiconductor layer A2, respectively. The first gate electrode G1 and the second gate electrode G2 may include a single layer or a multi-layer including molybdenum (Mo), aluminum (Al), copper (Cu), and/or titanium (Ti). For example, the first gate electrode G1 and the second gate electrode G2 may each be single layers including molybdenum (Mo).

A second gate insulating layer 113 may cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may include a single layer or a multi-layer including the inorganic insulating material.

A first top electrode CE2 of the main storage capacitor Cst and a second top electrode CE2' of the auxiliary storage capacitor Cst' may be arranged on the second gate insulating layer 113.

The first top electrode CE2 may overlap the first gate electrode G1 therebelow in the main display area MDA. The first gate electrode G1 and the first top electrode CE2 overlapping each other with the second gate insulating layer 113 therebetween may constitute the main storage capacitor Cst. The first gate electrode G1 may serve as a first bottom electrode CE1 of the main storage capacitor Cst.

The second top electrode CE2' may overlap the second gate electrode G2 therebelow in the component area CA. The second gate electrode G2 and the second top electrode CE2' overlapping each other with the second gate insulating layer 113 therebetween may constitute the auxiliary storage capacitor Cst'. The second gate electrode G2 may serve as a second bottom electrode CE1' of the auxiliary storage capacitor Cst'.

The first top electrode CE2 and the second top electrode CE2' may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

An interlayer insulating layer 115 may cover the first top electrode CE2 and the second top electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The first gate insulating layer 112, the second gate insulating layer 113, and the interlayer insulating layer 115 are collectively referred to as an inorganic insulating layer IL, and the inorganic insulating layer IL may include a first hole H1 corresponding to the transmission area TA. The first hole H1 may expose a top surface of the buffer layer 111 or the substrate 100. The first hole H1 may include openings in each of the first gate insulating layer 112, the second gate insulating layer 113, and the interlayer insulating layer 115 that overlap each other and that correspond to the transmission area TA. The openings may be respectively formed through a separate process or concurrently (e.g., simultaneously) formed through the same process. In the case where the openings are formed through a separate process, an inner surface of the first hole H1 may not be smooth and may have a step difference like a step shape.

In other embodiments, the inorganic insulating layer IL may include a groove instead of the first hole H1 exposing the buffer layer 111. In other embodiments, the inorganic insulating layer IL may not include the first hole H1 or the groove corresponding to the transmission area TA. Because the inorganic insulating layer IL generally includes an inorganic insulating material having an excellent light transmittance, even though the inorganic insulating layer IL does not include a hole or groove corresponding to the transmission area TA, the inorganic insulating layer IL may have a sufficient transmittance to allow the component 40 to transmit/receive a sufficient amount of light (see, e.g., FIG. 2).

The source electrodes S1 and S2 and the drain electrodes D1 and D2 are arranged on the interlayer insulating layer 115. The source electrodes S1 and S2 and the drain electrodes D1 and D2 may include a conductive material including molybdenum (Mo), aluminum (Al), copper (Cu), and/or titanium (Ti) and include a single layer or a multi-layer including the above materials. For example, the source electrodes S1 and S2 and the drain electrodes D1 and D2 may include a multi-layered structure of Ti/Al/Ti.

A first planarization layer 117 may cover the source electrodes S1 and S2 and the drain electrodes D1 and D2. The first planarization layer 117 may have a flat top surface such that a first pixel electrode 121 and a second pixel electrode 121' arranged thereon are formed flat.

The first planarization layer 117 may include an organic material or an inorganic material and have a single layered structure or a multi-layered structure. The first planarization layer 117 may include a general-purpose polymer such as benzocyclobutene (BCB), polyimide, hexamethyldisiloxane (HMDSO), polymethylmethacrylate (PMMA) and/or polystyrene (PS), polymer derivatives having a phenol-based group, an acryl-based polymer, an imide-based polymer, an aryl ether-based polymer, an amide-based polymer, a fluorine-based polymer, a p-xylene-based polymer, and/or a vinyl alcohol-based polymer. The first planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). After the first planarization layer 117 is formed, chemical mechanical polishing may be performed on a top surface of the first planarization layer 117 to provide a flat top surface.

The first planarization layer 117 may include a second hole H2 corresponding to the transmission area TA. The second hole H2 may overlap the first hole H1. It is shown in FIG. 7 that the second hole H2 is greater than the first hole H1. In other embodiments, the first planarization layer 117 may cover the edges of the first hole H1 of the inorganic insulating layer IL, and the area of the second hole H2 may be narrower than the area of the first hole H1.

The first planarization layer 117 may include an opening exposing one of the first source electrode S1 and the first drain electrode D1 of the main thin film transistor TFT, and the first pixel electrode 121 may be electrically connected to the main thin film transistor TFT by contacting the first source electrode S1 or the first drain electrode D1 through the opening. In addition, the first planarization layer 117 may include an opening exposing one of the second source electrode S2 and the second drain electrode D2 of the auxiliary thin film transistor TFT', and the second pixel electrode 121' may be electrically connected to the auxiliary thin film transistor TFT' by contacting the second source electrode S2 or the second drain electrode D2 through the opening.

The first pixel electrode 121 and the second pixel electrode 121' may include a conductive oxide such as indium tin oxide (ITO), zinc oxide (IZO), zinc oxide (ZnO), indium oxide ($In_2O_3$), indium gallium oxide (IGO), and/or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. For example, the first pixel electrode 121 and the second pixel electrode 121' may have a structure having layers including ITO, IZO, ZnO, and/or $In_2O_3$ on and/or under the reflective layer. In this case, the first pixel electrode 121 and the second pixel electrode 121' may have a stacked structure of ITO/Ag/ITO.

A pixel-defining layer 119 may cover the edges of the first pixel electrode 121 and the second pixel electrode 121'. The pixel-defining layer 119 includes a first opening OP1 and a second opening OP2 respectively overlapping the first pixel electrode 121 and the second pixel electrode 121' and defining emission areas of the sub-pixels Pm and Pa respectively. The pixel-defining layer 119 may substantially prevent or prevent an arc, etc. from occurring at the edges of the pixel electrodes. for example, the first pixel electrode 121 and the second pixel electrode 121', by increasing a distance between the edges the pixel electrodes, i.e., the first pixel electrode 121 and the second pixel electrode 121', and an opposite electrode 223 over the pixel electrodes, i.e., the first pixel electrode 121 and the second pixel electrode 121'. The pixel-defining layer 119 may include an organic insulating material including polyimide, polyamide, an acrylic resin, benzocyclobutene, HMDSO, and/or a phenolic resin, and it may be formed by spin coating.

The pixel-defining layer 119 may include a third hole H3 located in the transmission area TA. The third hole H3 may overlap the first hole H1 and the second hole H2. A light transmittance of the transmission area TA may be improved by the first to third holes H1, H2, and H3. A portion of the opposite electrode 123 described below may be arranged on inner lateral walls of the first to third holes H1, H2, and H3.

A first emission layer 122b and a second emission layer 122b' are respectively arranged inside the first opening OP1 and the second opening OP2 of the pixel-defining layer 119, the first emission layer 122b and the second emission layer 122b' respectively corresponding to the first pixel electrode 121 and the second pixel electrode 121'. The first emission layer 122b and the second emission layer 122b' may include a polymer material or a low molecular weight material and may emit red, green, blue, or white light.

An organic functional layer 122e may be arranged on and/or under the first emission layer 122b and the second emission layer 122b'. The organic functional layer 122e may include a first functional layer 122a and/or a second functional layer 122c. In some embodiments, the first functional layer 122a or the second functional layer 122c may be omitted.

The first functional layer 122a may be arranged under the first emission layer 122b and the second emission layer 122b'. The first functional layer 122a may include a single layer or a multi-layer including an organic material. The first functional layer 122a may include a hole transport layer (HTL), which has a single-layered structure. The first functional layer 122a may include a hole injection layer (HIL) and/or an HTL. In some embodiments, the first functional layer 122a may be provided as one body to corresponding to the main sub-pixels Pm and the auxiliary sub-pixels Pa in the main display area MDA and the component area CA. Therefore, the first functional layer 122a may be arranged to correspond to the transmission area TA.

The second functional layer 122c may be arranged on the first emission layer 122b and the second emission layer 122b'. The second functional layer 122c may include a single layer or a multi-layer including an organic material. The second functional layer 122c may include an electron transport layer (ETL) and/or an electron injection layer (EIL). In some embodiments, the second functional layer 122c may be provided as one body to corresponding to the main sub-pixels Pm and the auxiliary sub-pixels Pa in the main display area MDA and the component area CA.

Therefore, the second functional layer 122c may be arranged to correspond to the transmission area TA.

The opposite electrode 123 is arranged on the second functional layer 122c. The opposite electrode 123 may include a conductive material having a low work function. For example, the opposite electrode 123 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In some embodiments, the opposite electrode 123 may further include a layer including ITO, IZO, ZnO, and/or $In_2O_3$ on/under the (semi)-transparent layer including the above materials. The opposite electrode 123 may be provided as one body (i.e., one continuous layer that may be deposited concurrently) to correspond to the main sub-pixels Pm and the auxiliary sub-pixels Pa in the main display area MDA and the component area CA.

The layers from the first pixel electrode 121 to the opposite electrode 123 in the main display area MDA may constitute the organic light-emitting diode OLED. The layers from the second pixel electrode 121' to the opposite electrode 123 in the component area CA may constitute the auxiliary organic light-emitting diode OLED'.

A top layer 150 may be formed on the opposite electrode 123, the top layer 150 including an organic material. The top layer 150 may be a layer prepared to protect the opposite electrode 123 and, at the same time, to raise a light extraction efficiency. The top layer 150 may include an organic material having a higher refractive index than that of the opposite electrode 123. In some embodiments, the top layer 150 may include layers that are stacked, the layers having different refractive indexes. For example, the top layer 150 may include a high refractive index-layer/a low refractive index-layer/a high refractive index-layer that are stacked. In this case, the refractive index of the high refractive index-layer may be 1.7 or more, and the refractive index of the low refractive index-layer may be 1.3 or less.

The top layer 150 may further include lithium fluoride (LiF). Alternatively, the top layer 150 may further include an inorganic insulating material such as silicon oxide ($SiO_2$) and/or silicon nitride ($SiN_x$).

The first functional layer 122a, the second functional layer 122c, the opposite electrode 123, and the top layer 150 each may include the transmission hole TAH corresponding to the transmission area TA. That is, the first functional layer 122a, the second functional layer 122c, the opposite electrode 123, and the top layer 150 may each include openings corresponding to the transmission area TA. The area of the openings may be substantially the same. For example, the area in which the opposite electrode 123 is not located may be substantially the same as the area of the transmission hole TAH.

When the transmission hole TAH corresponds to the transmission area TA, the transmission hole TAH may overlap the transmission area TA. In this case, the area of the transmission hole TAH may be less than the area of the first hole H1 formed in the inorganic insulating layer IL. In this embodiment, it is shown in FIG. 7 that a width Wt of the transmission hole TAH is less than a width W1 of the first hole H1. Here, the area of the transmission hole TAH may be defined as the area of an opening having a smallest area among the openings constituting the transmission hole TAH. The area of the first hole H1 may be defined as the area of an opening having a smallest area among the openings constituting the first hole H1. Though it is shown in the drawing that the width Wt of the transmission hole TAH is equal to a width of the bottom-hole BMLH of the bottom metal layer BML, the embodiment is not limited thereto. In some embodiments, the width Wt of the transmission hole TAH may be greater than the width of the bottom-hole BMLH of the bottom metal layer BML.

A portion of the opposite electrode 123 is removed at the transmission hole TAH, and through this, a light transmittance of the transmission area TA may be remarkably raised. The opposite electrode 123 may be formed by various methods. For example, the opposite electrode 123 including the opening may be formed by forming a layer by using a material for the opposite electrode 123 and then removing a portion corresponding to the transmission area TA through laser-lift off. In some embodiments, when forming the opposite electrode 123, the opposite electrode 123 including the opening may be formed through metal-self patterning (MSP). In some embodiments, when forming the opposite electrode 123, the opposite electrode 123 including the opening may be formed through fine metal mask (FMM) patterning.

Figure 8:
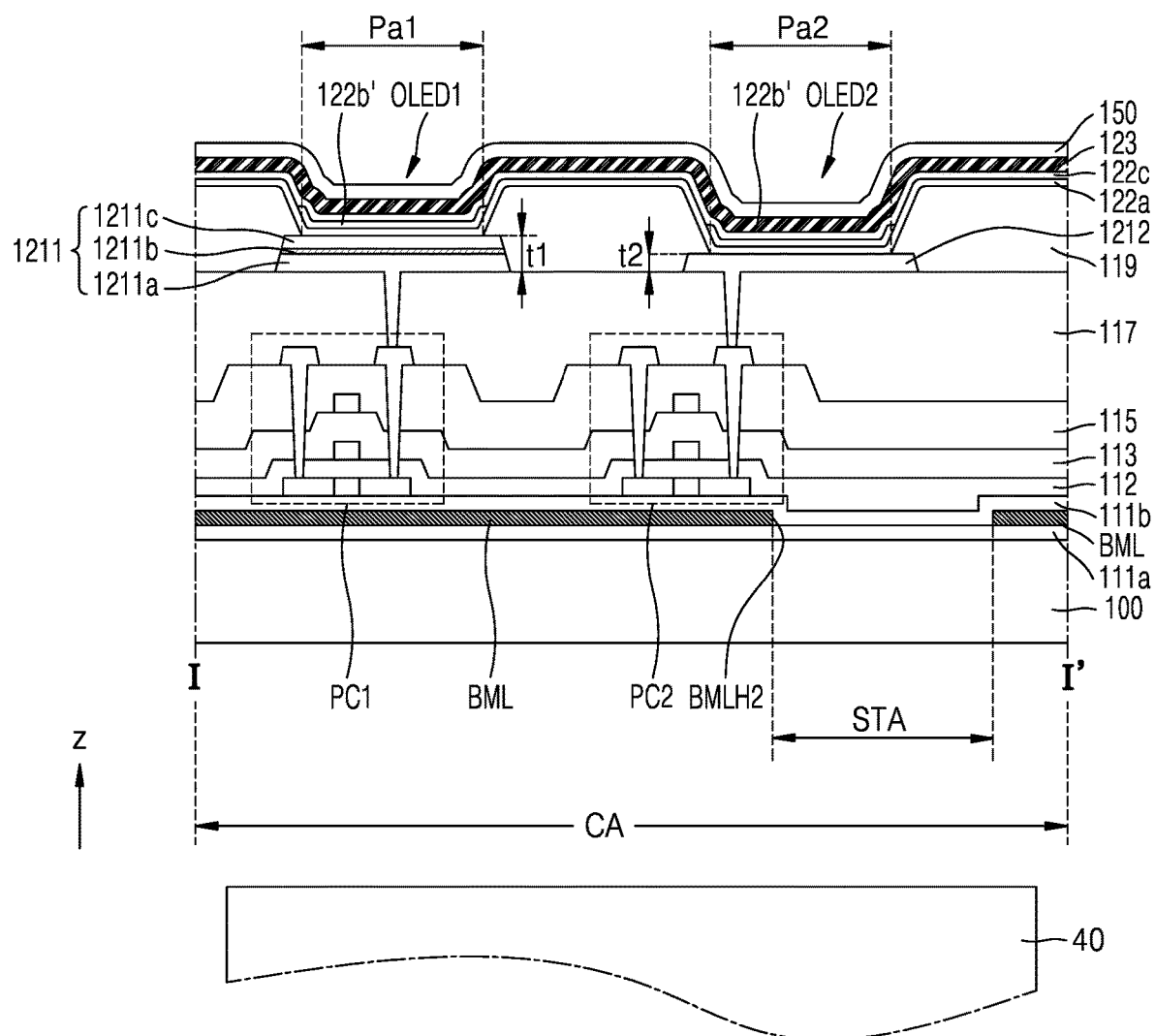
FIG. 8 is a cross-sectional view of the component area of the display panel taken along the line I-I' of FIG. 6C, according to one or more embodiments.

FIG. 8 is a cross-sectional view of the component area CA of the display panel 10 taken along the line I-I' of FIG. 6C, according to a first embodiment. In FIG. 8, because the same reference numerals denote the same elements as those of FIG. 7, repeated descriptions thereof may be omitted.

Referring to FIG. 8, a first auxiliary sub-pixel Pa1 and a second auxiliary sub-pixel Pa2 are arranged in the component area CA. The first auxiliary sub-pixel Pa1 may correspond to an emission area of a first organic light-emitting diode OLED1, and the second auxiliary sub-pixel Pa2 may correspond to an emission area of a second organic light-emitting diode OLED2.

A first pixel electrode 1211 of the first organic light-emitting diode OLED1 may include a reflective layer 1211b. Because the first pixel electrode 1211 includes the reflective layer 1211b, light generated by the emission layer 122b' of the first organic light-emitting diode OLED1 may be reflected by the reflective layer 1211b and emitted in a top direction (a +z-direction) from the substrate 100. That is, light emission efficiency in the top direction of the substrate 100 may be increased. In an embodiment, the first pixel electrode 1211 may include a first transparent electrode layer 1211a, the reflective layer 1211b, and a second transparent electrode layer 1211c that are sequentially stacked.

The first transparent electrode layer 1211a and the second transparent electrode layer 1211c may include a transparent conductive oxide such as indium tin oxide (ITO), zinc oxide (IZO), zinc oxide (ZnO), indium oxide ($In_2O_3$), indium gallium oxide (IGO), and/or aluminum zinc oxide (AZO).

The reflective layer 1211b may include silver (Ag), magnesium (Mg), aluminum (Al), platinum (Pt), palladium (Pd), gold (Au), nickel (Ni), neodymium (Nd), iridium (Ir), chrome (Cr), and/or a compound thereof.

A second pixel electrode 1212 of the second organic light-emitting diode OLED2 may include a transparent conductive material without including a reflective layer. The second pixel electrode 1212 may include a transparent conductive oxide such as indium tin oxide (ITO), zinc oxide (IZO), zinc oxide (ZnO), indium oxide ($In_2O_3$), indium gallium oxide (IGO), and/or aluminum zinc oxide (AZO).

Because the second pixel electrode 1212 includes the transparent conductive material without including the reflective layer, at least a portion of external light may pass through the second pixel electrode 1212. That is, light/signal emitted from the component 40 or light and/or signal incident to the component 40 may pass through the second organic light-emitting diode OLED2. A region in which the second organic light-emitting diode OLED2 is arranged is referred to as the semi-transmission area STA. The semi-transmission area STA may be a region in which a display element (e.g., the second organic light-emitting diode OLED2) that may transmit light is arranged and which has a small light transmittance.

Because the second pixel electrode 1212 of the second organic light-emitting diode OLED2 does not include a reflective layer, a light emission rate of the second organic light-emitting diode OLED2 in a top direction of the substrate 100 may be less than that of the first organic light-emitting diode OLED1. The brightness of the second auxiliary sub-pixel Pa2 may be less than the brightness of the first auxiliary sub-pixel Pa1 under the same conditions.

The second pixel electrode 1212 may be concurrently (e.g., simultaneously) formed while the first transparent electrode layer 1211a of the first pixel electrode 1211 is formed. In some embodiments, a portion of the second pixel electrode 1212 may be formed while the first transparent electrode layer 1211a of the first pixel electrode 1211 is formed, and the rest of the second pixel electrode 1212 may be formed while the second transparent electrode layer 1211b of the first pixel electrode 1211 is formed. Therefore, a thickness t2 of the second pixel electrode 1212 may be less than a thickness t1 of the first pixel electrode 1211.

The first organic light-emitting diode OLED1 may be driven by a first pixel circuit PC1, and the second organic light-emitting diode OLED2 may be driven by a second pixel circuit PC2. In the present embodiment, the second pixel circuit PC2 may be arranged to minimally overlap the second pixel electrode 1212. The bottom metal layer BML may be arranged to overlap bottom portions of the first pixel circuit PC1 and the second pixel circuit PC2. The bottom metal layer BML may include a bottom-hole BMLH2 corresponding to the semi-transmission area STA.

Figure 9:
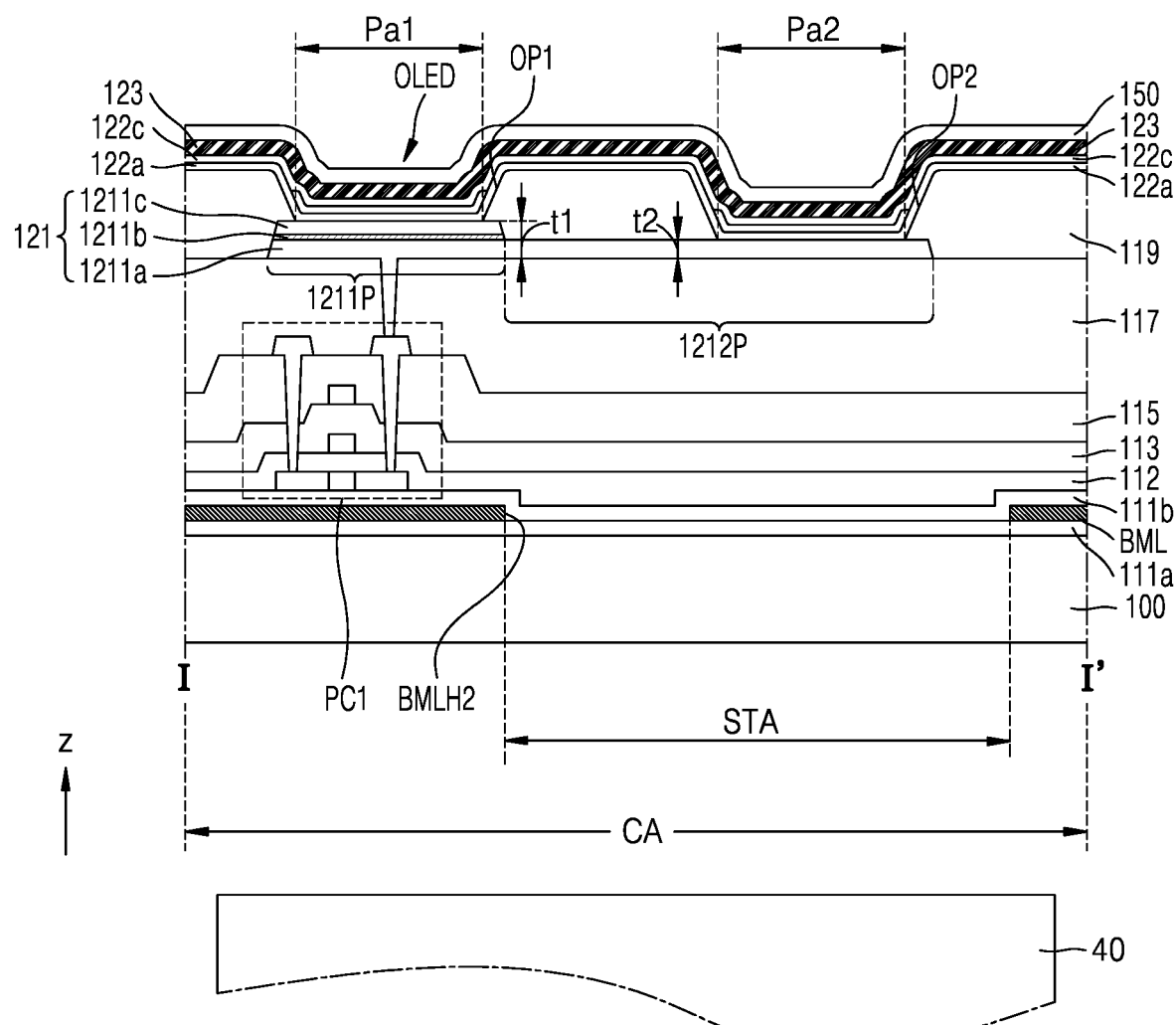
FIG. 9 is a cross-sectional view of the component area of the display panel taken along the line I-I' of FIG. 6C, according to one or more embodiments.

FIG. 9 is a cross-sectional view of the component area CA of the display panel 10 taken along the line I-I' of FIG. 6C, according to a second embodiment. In FIG. 9, because the same reference numerals denote the same elements as those of FIG. 7, repeated descriptions thereof may be omitted.

Referring to FIG. 9, one organic light-emitting diode OLED arranged in the component area CA may include two emission areas. The emission areas may respectively correspond to the first auxiliary sub-pixel Pa1 and the second auxiliary sub-pixel Pa2.

In the present embodiment, the pixel electrode 121 of the organic light-emitting diode OLED may include a first pixel electrode portion 1211P and a second pixel electrode portion 1212P, the first pixel electrode portion 1211P including a reflective layer 1211b, and the second pixel electrode portion 1212P including a transparent conductive material. The pixel-defining layer 119 may define the emission areas by including a first opening OP1 and a second opening OP2, the first opening OP1 exposing a portion of the first pixel electrode portion 1211P, and the second opening OP2 exposing a portion of the second pixel electrode portion 1212P.

The first pixel electrode portion 1211P may include the first transparent electrode layer 1211a, the reflective layer 1211b, and the second transparent electrode layer 1211c that are sequentially stacked. The second pixel electrode portion 1212P may be provided by extending the second transparent electrode layer 1211c of the first pixel electrode portion 1211P. The second pixel electrode portion 1212P may include only the first transparent electrode layer 1211a, or may include the first transparent electrode layer 1211a and the second transparent electrode layer 1211c that are stacked.

Because the second pixel electrode portion 1212P does not include a reflective layer and includes a transparent conductive material, external light may pass through a portion of the organic light-emitting diode OLED. The second pixel electrode portion 1212P of the organic light-emitting diode OLED may be arranged in the semi-transmission area STA. The bottom metal layer BML may include a bottom-hole BMLH2 corresponding to the semi-transmission area STA.

Because the second pixel electrode portion 1212P of the organic light-emitting diode OLED does not include a reflective layer, the brightness of the second auxiliary sub-pixel Pa2 may be less than the brightness of the first auxiliary sub-pixel Pa1. A thickness t2 of the second pixel electrode portion 1212P may be less than a thickness t1 of the first pixel electrode portion 1211P. Because the first auxiliary sub-pixel Pa1 and the second auxiliary sub-pixel Pa2 are implemented by one organic light-emitting diode OLED, the first auxiliary sub-pixel Pa1 and the second auxiliary sub-pixel Pa2 may be concurrently (e.g., simultaneously) driven by one pixel circuit PC1.

Figure 10:
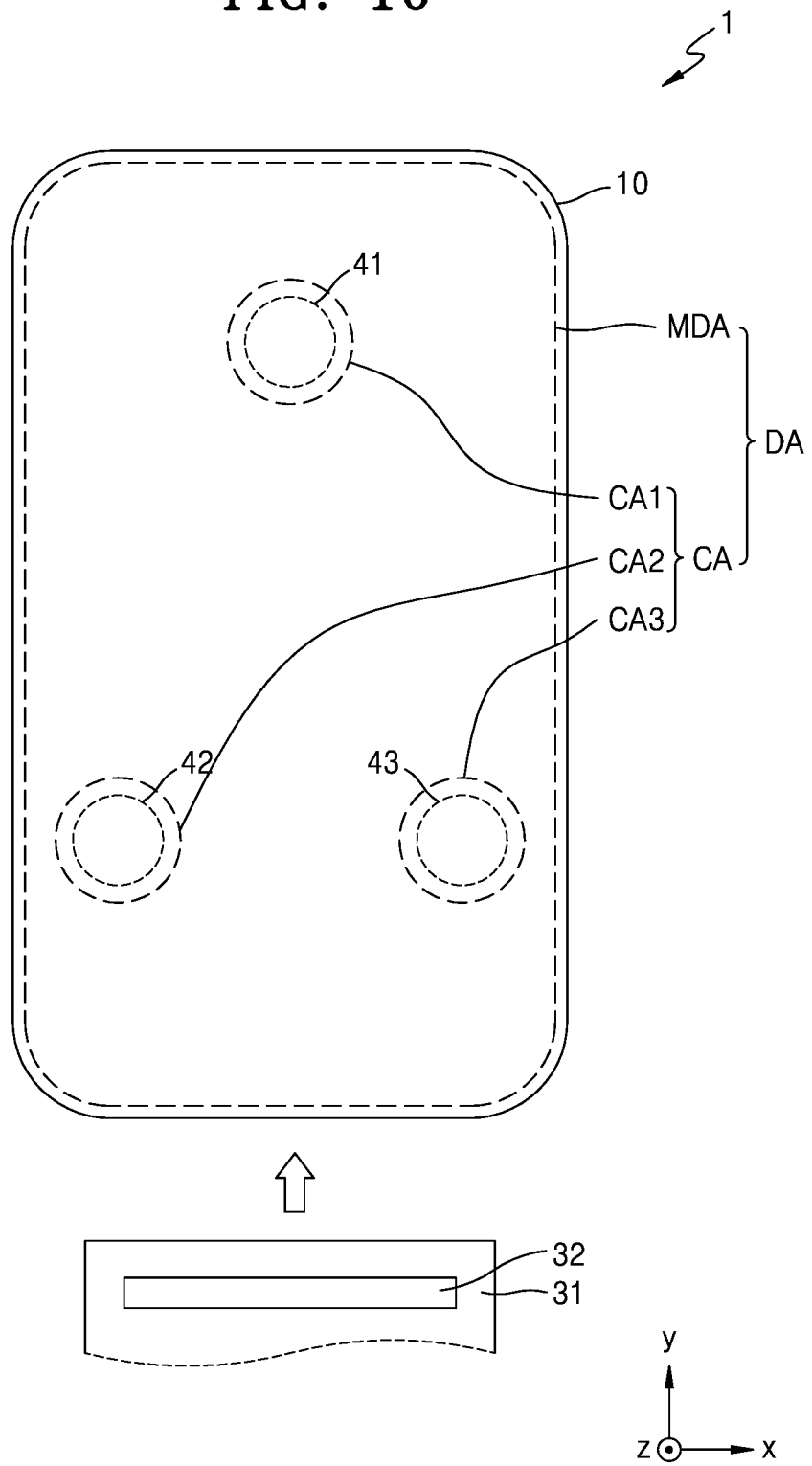
FIG. 10 is a plan view of the display device according to an embodiment.

FIG. 10 is a plan view of the display panel 10 and components therebelow according to an embodiment.

Referring to FIG. 10, the component area CA may include a plurality of component areas CA1, CA2, CA3 in the display area DA. The component areas CA1, CA2, CA3 may have a circular shape, and may be arranged inside the main display area MDA, and surrounded by the main display area MDA.

The component area CA may include a first component area CA1 on the top center of the display panel 10, a second component area CA2 on the bottom left of the display panel 10, and a third component area CA3 on the bottom right of the display panel 10. First to third components 41, 42, and 43 may be arranged below the display panel 10 to correspond to the first to third component areas CA1, CA2, and CA3, respectively. The first to third components 41, 42, and 43 may be cameras that capture an image. In this case, because an image may be captured at various angles, an image may be compensated for based on images captured by the first to third components 41, 42, and 43.

In the case where a plurality of component areas CA is provided, pixel arrangement structures and resolutions of respective component areas CA may be different from each other. For example, the first component area CA1 may employ the pixel arrangement structure shown in FIG. 6A, the second component area CA2 may employ the pixel arrangement structure shown in FIG. 6B, and the third component area CA3 may employ the pixel arrangement structure shown in FIG. 6C or 6D.

Figure 11A:
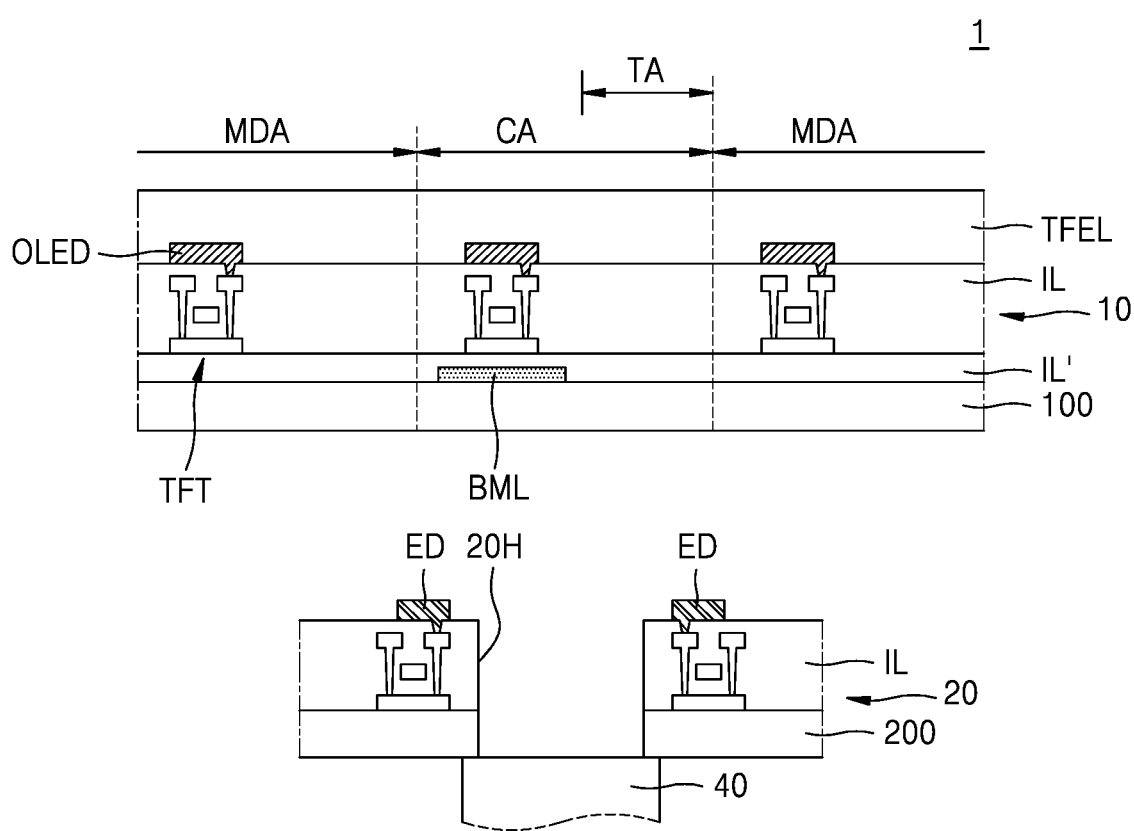
FIGS. 11A and 11B are cross-sectional views of portions of the display device according to embodiments of the present disclosure.
Figure 11B:
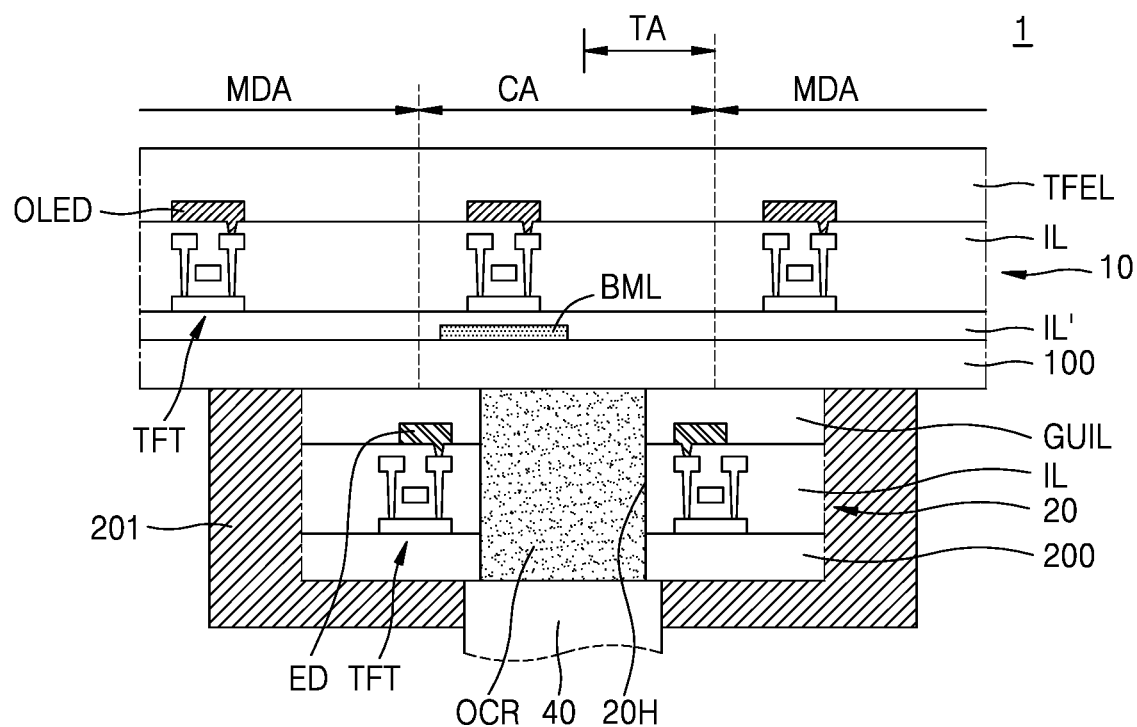
Figure 12:
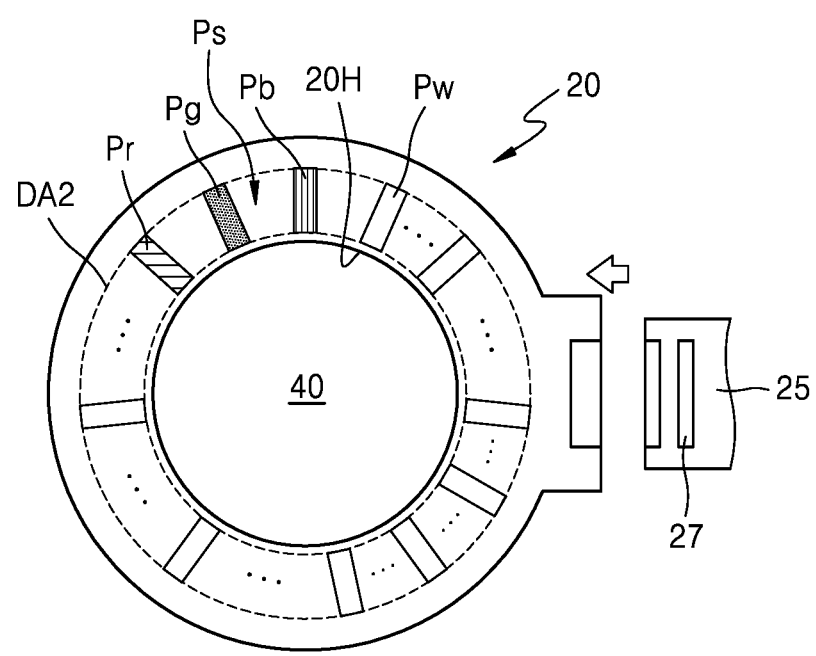
FIG. 12 is a plan view of a second display panel applicable to FIGS. 11A and 11B.

FIGS. 11A and 11B are cross-sectional views of portions of the display device 1 according to embodiments of the present disclosure, and FIG. 12 is a plan view of a second display panel 20 that may be included in the display device 1.

Referring to FIGS. 11A and 11B, the display device 1 may further include the second display panel 20 below the first display panel 10. The first display panel 10 may be the display panel described with reference to FIGS. 1 to 10. The second display panel 20 may include a substrate 200, a circuit layer on the substrate 200, a light-emitting diode ED as the display element, and an insulating layer IL therebetween, the circuit layer including the thin film transistor TFT.

The second display panel 20 may include a hole 20H corresponding to the component area CA of the first display panel 10. The component 40 may be arranged under the second display panel 20 to correspond to the hole 20H.

As shown in FIG. 11B, the second display panel 20 may be attached on the first display panel 10. In this embodiment, an optically clear resin OCR may fill the inside of the hole 20H of the second display panel 20. The OCR has an optical transparency and thus may improve visibility.

In addition, a light guide layer GUIL may be arranged on the light-emitting diode ED. The light guide layer GUIL may diffuse light emitted from the light-emitting diode ED. The light guide layer GUIL may include an acryl material and/or polymethylmethacrylate (PMMA). To substantially prevent or prevent light diffused from the light guide layer GUIL from being emitted in a lateral direction, a light leakage prevention layer 201 may be further arranged around the light-emitting diode ED, that is, around the second display panel 20. The light leakage prevention layer 201 may include at least one of black pigment, black dye, chrome (Cr), and chrome oxide ($CrO_x$).

The light-emitting diodes ED arranged on the second display panel 20 may be arranged to correspond to the edge of the component area CA. In some embodiments, the light-emitting diodes ED may be arranged to correspond to the edge of the component 40. That is, the light-emitting diodes ED may surround the component 40, as shown, for example, in FIG. 12 (where the light-emitting diodes are included in sub-pixels Ps). In some embodiments, the light-emitting diodes ED may surround the hole 20H of the second display panel 20. The light-emitting diodes ED may include inorganic light-emitting diodes having a micro size or a nano size.

Sub-pixels Ps of the second display panel 20 may be implemented by the light-emitting diodes ED. The sub-pixels Ps of the second display panel 20 may include a red sub-pixel Pr, a green sub-pixel Pg, a blue sub-pixel Pb, and/or a white sub-pixel Pw. The sub-pixels Ps may be arranged in a circular shape around the hole 20H. Therefore, a second display area DA2 in which the sub-pixels Ps are arranged in a ring shape may be provided.

One side of the second display panel 20 may be connected to a second display circuit board 25. The second display circuit board 25 may include a second display driver 27 driving the second display panel 20. The second display driver 27 may generate a signal controlling the brightness and the color of sub-pixels Ps of the second display panel 20 in response to a driving signal of the first display panel 10 and a driving signal of the component 40.

For example, in the case where a red image is displayed on the component area CA of the first display panel 10, the second display driver 27 may generate a signal driving a red sub-pixel Pr of the second display panel 20. In the case where a scarlet image is displayed on the component area CA of the first display panel 10, the second display driver 27 may generate a signal driving a red sub-pixel Pr and a blue sub-pixel Pb of the second display panel 20.

Because the component area CA of the first display panel 10 includes the transmission area TA, the brightness of an image displayed in the component area CA may be less than the brightness of an image displayed in the main display area MDA.

In the present embodiment, because an image is displayed in the second display area DA2 that overlaps the component area CA by employing the second display panel 20, the visibility of the image may be improved by compensating for the brightness and the color of the component area CA.

As described above, the first display panel 10 may include a plurality of component areas CA, and the second display panel 20 may include light-emitting diodes ED for each component area CA, the light-emitting diodes ED surrounding the component area CA. In this case, sub-pixels Ps arranged in the second display panel 20 may be individually driven depending on a color implemented in each component area CA. For example, in the case where the first component area is red and the second component area is green, a red sub-pixel Pr may be driven in a portion of the second display panel 20 corresponding to the first component area, and a green sub-pixel Pg may be driven in a portion of the second display panel 20 corresponding to the second component area.

Figure 13A:
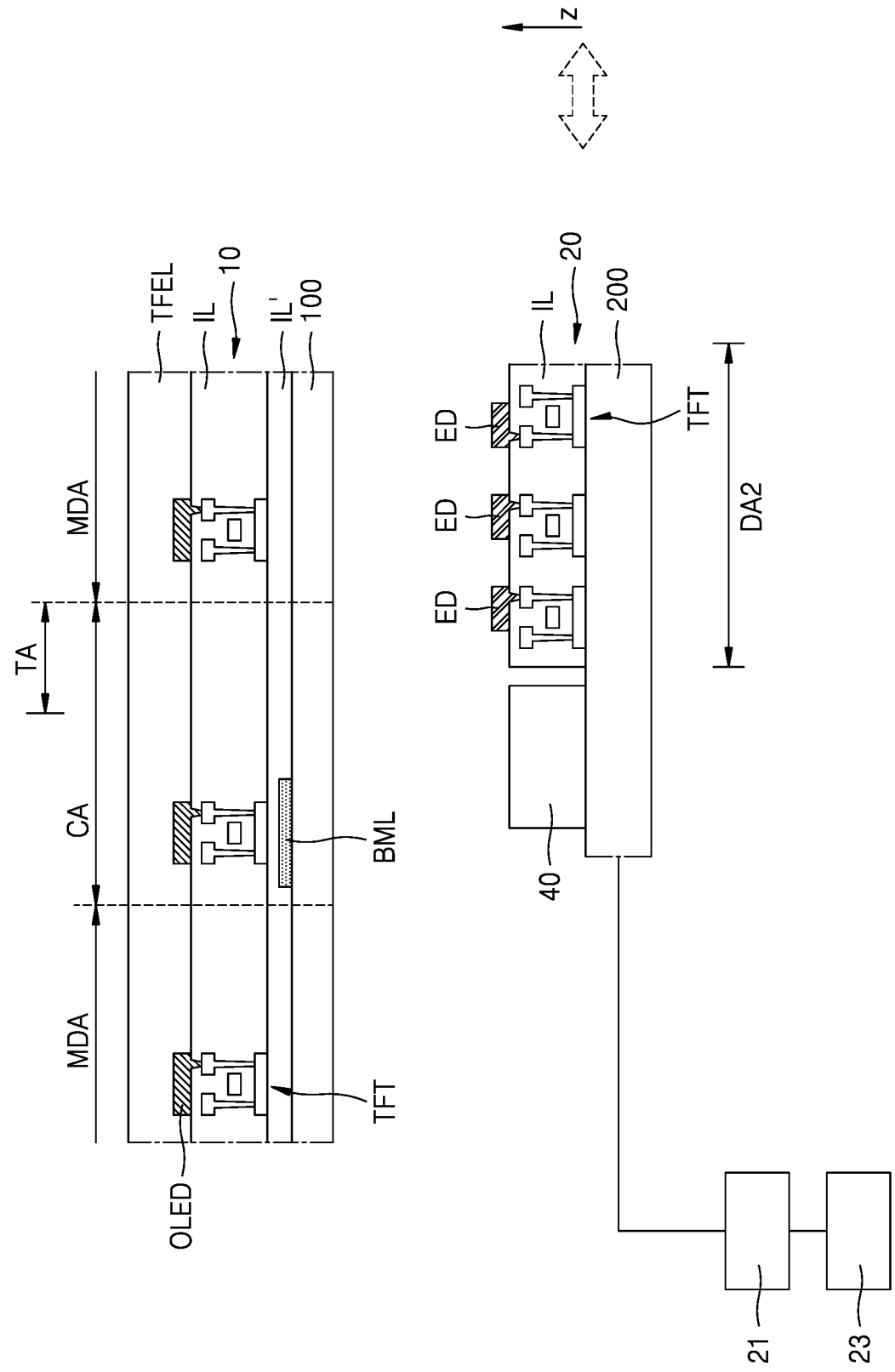
Figure 14A:
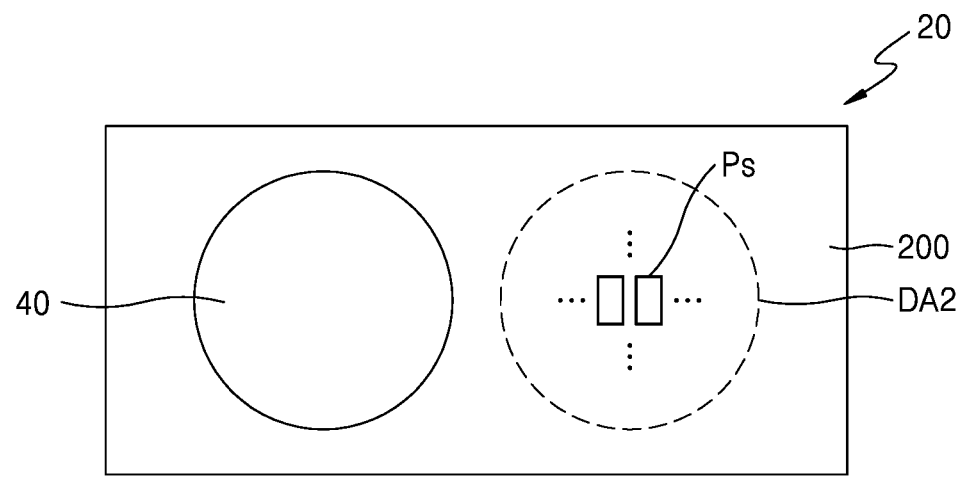
FIGS. 14A and 14B are plan views of embodiments of a second display panel applicable to FIGS. 13A and 13B.
Figure 14B:
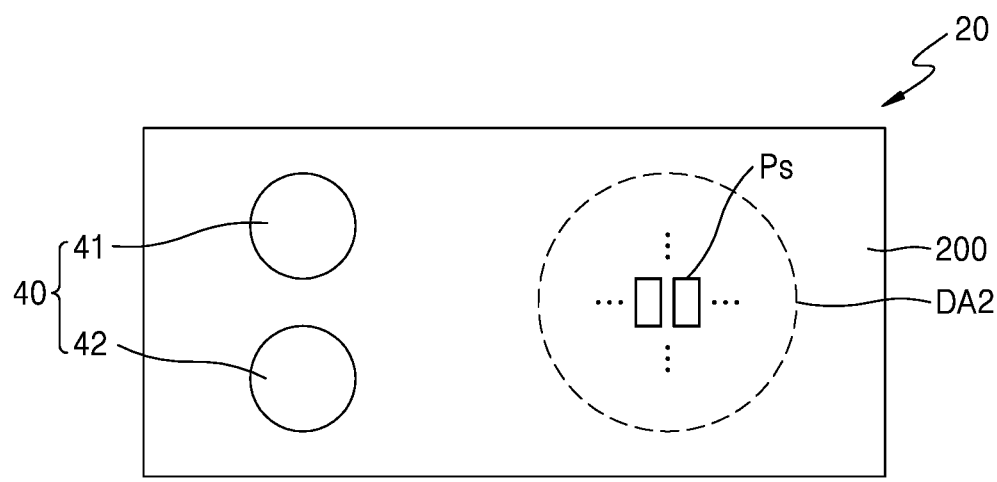

FIGS. 13A and 13B are cross-sectional views of a portion of the display device 1 according to a further embodiment. FIGS. 14A and 14B are plan views of the second display panel 20 that may be included in the display device 1.

Referring to FIGS. 13A to 14B, the display device 1 may further include the second display panel 20 below the first display panel 10. The first display panel 10 may be the display panel described with reference to FIGS. 1 to 10.

The second display panel 20 may include the substrate 200, the circuit layer on the substrate 200, the light-emitting diode ED as the display element, and the insulating layer IL therebetween, the circuit layer including the thin film transistor TFT. In addition, the component 40 may be arranged on the second display panel 20. That is, the component 40 may be mounted on the second display panel 20 and may constitute a portion of the second display panel 20.

As shown in FIG. 14B, multiple components 40 may be provided. A first component 41 and a second component 42 may be mounted on the second display panel 20. In some embodiments, the first component 41 may include a camera to capture an image, and the second component 42 may include a flash provided as a light-emitting diode (LED). In some embodiments, the first component 41 may include a camera to capture an image, and the second component 42 may include a solar battery. The number of components 40 mounted on the second display panel 20 may be three or more. As described above, the component 40 may include various components such as an infrared sensor, an iris sensor, and an ultrasonic sensor.

When a region of the second display panel 20 in which light-emitting diodes ED are arranged is referred to as the second display area DA2, the component 40 may be arranged on one side of the second display area DA2. The area of the second display area DA2 may correspond to the area of the component area CA of the first display panel 10.

The second display panel 20 may move relative to the first display panel 10 with a predetermined interval. That is, the second display panel 20 may move on an x-y plane while maintaining a predetermined interval from the first display panel 10 in a z-direction. The second display panel 20 may be moved by a movement driver 21 provided as a linear motor, etc., as shown, for example, in FIGS. 13A and 13B. The movement driver 21 may be driven by a command of a controller 23.

In some embodiments, the second display panel 20 may be moved in cooperation with an operation of the component 40. For example, as shown in FIG. 13A, in the case where the component 40 operates, the second display panel 20 may be arranged such that the component 40 overlaps the component area CA of the first display panel 10. In addition, as shown in FIG. 13B, in the case where the component 40 is not operating, the second display panel 20 may be arranged such that the second display area DA2 in which the light-emitting diodes ED are arranged overlaps the component area CA.

The sub-pixels Ps implemented by the light-emitting diodes ED may be arranged in the second display area DA2. The sub-pixels Ps may include red, green, blue, and/or white sub-pixels. In some embodiments, when the sub-pixels Ps arranged in the second display area DA2 overlap the first display panel 10, the sub-pixels Ps may be arranged to correspond to the transmission area TA. In some embodiments, when the sub-pixels Ps arranged in the second display area DA2 overlap the first display panel 10, the sub-pixels Ps may be arranged to surround the edge of the component area CA. The sub-pixels Ps may be arranged in various pixel arrangement structures such as a stripe structure, a circular structure, and/or a PenTile® structure.

Figure 15:
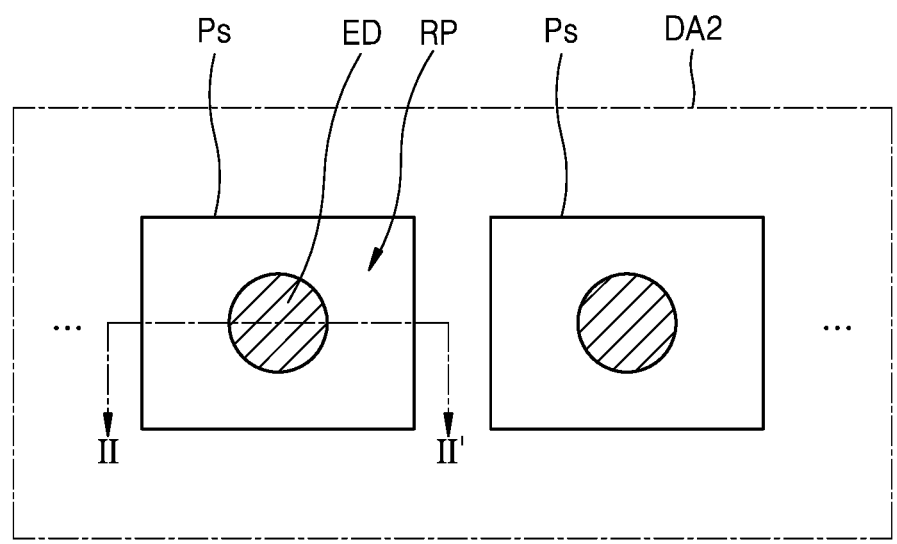
FIG. 15 is a plan view of a second display area of the second display panel according to an embodiment.
Figure 16:
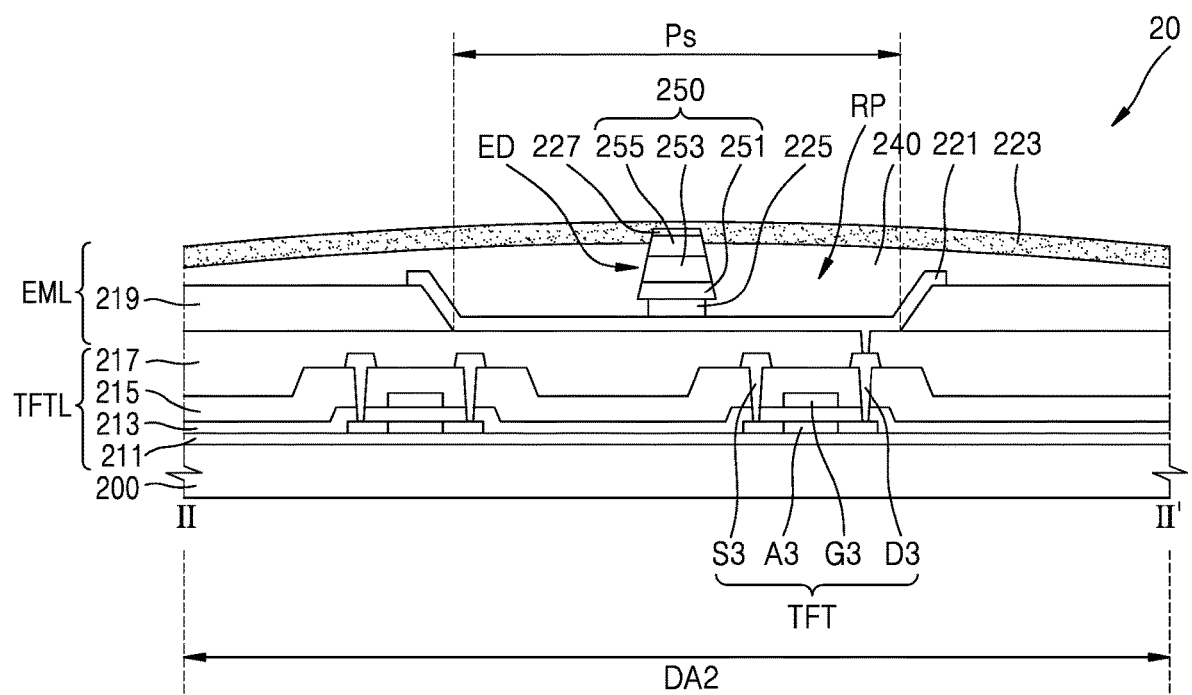
FIG. 16 is a cross-sectional view taken along the line II-II' of FIG. 15.

FIG. 15 is a plan view of the second display area DA2 of the second display panel 20 according to an embodiment. FIG. 16 is a cross-sectional view of the second display area DA2 taken along the line II-II' of FIG. 15.

Referring to FIGS. 15 and 16, each sub-pixel Ps may be implemented by the light-emitting diode ED, which, in this embodiment, is an inorganic micro light-emitting diode LED, as a display element. The second display panel 20 may include a thin film transistor layer TFTL and an emission element layer EML arranged on the substrate 200. At least one thin film transistor TFT and at least one capacitor may be arranged in the thin film transistor layer TFTL. The light-emitting diode ED, which is an inorganic micro light-emitting diode LED used as the display element, is arranged in the emission element layer EML. FIG. 16 shows an example having two thin film transistors TFT and one of the two thin film transistors TFT is connected to the light-emitting diode ED.

A buffer layer 211 may be provided on the substrate 200. The thin film transistor TFT and the light-emitting diode ED may be provided on the buffer layer 211.

The substrate 200 may include glass or a plastic. The buffer layer 211 may block the penetration of impurities through the substrate 200, may planarize a surface of the substrate 200, and may include a single layer or a multi-layer including an inorganic material such as silicon oxide ($SiO_2$) and/or silicon nitride ($SiN_x$).

The thin film transistor TFT includes an active layer A3, a gate electrode G3, a source electrode S3, and a drain electrode D3. The active layer A3 may include a semiconductor material and includes a source region, a drain region, and a channel region between the source region and the drain region. The gate electrode G3 is formed over the active layer A3 to correspond to the channel region. The source electrode S3 and the drain electrode D3 are respectively and electrically connected to the source region and the drain region of the active layer A3. A gate insulating layer 213 is arranged between the active layer A3 and the gate electrode G3, the gate insulating layer 213 including an inorganic material. An interlayer insulating layer 215 is arranged between the gate electrode G3 and the source and drain electrodes S3, D3. A planarization layer 217 is arranged on the source and drain electrodes S3, D3. Each of the interlayer insulating layer 215 and the planarization layer 217 may include an organic insulating material or an inorganic insulating material, or may include an organic insulating material and an inorganic insulating material that are alternately arranged.

A bank 219 is arranged on the planarization layer 217, the bank 219 defining a region of the sub-pixel Ps. The bank 219 includes a recessed portion RP in which the light-emitting diode ED is received. The height of the bank 219 may be determined by the height of the light-emitting diode ED and a viewing angle. The size (e.g., the width) of the recessed portion RP may be determined by the resolution, the sub-pixel density, etc. of the second display panel 20. In some embodiments, the height of the light-emitting diode ED may be greater than the height of the bank 219. Though FIG. 15 shows an example in which the recessed portion RP has a quadrangular shape, the embodiments are not limited thereto and the recessed portion RP may have various shapes such as a polygon, a rectangle, a circle, a conic shape, an ellipse, and/or a triangle.

A first electrode 221 is arranged along a lateral surface and a bottom surface of the recessed portion RP, and a top surface of the bank 219 around the recessed portion RP. The first electrode 221 is electrically connected to the source electrode S3 or the drain electrode D3 of the thin film transistor TFT through a via hole in the planarization layer 217. For example, it is shown in FIG. 16 that the first electrode 221 is electrically connected to the drain electrode D3.

The bank 219 serves as a light-blocking portion having a low light transmittance and may reduce or prevent color mixing of pieces of light emitted from neighboring light-emitting diodes ED by blocking light emitted to a lateral surface of the light-emitting diode ED. In addition, the bank 219 may improve the contrast of the display panel 20 by absorbing and blocking incident light from the outside. The bank 219 may include a material that absorbs at least a portion of light, a light-reflecting material, and/or a light-scattering material. For example, the bank 219 may include a semi-transparent or opaque insulating material with respect to visible light (e.g., light in the wavelength range from about 280 nm to about 750 nm). The bank 219 may include an organic insulating material such as polycarbonate, polyethylene terephthalate (PET), polyethersulfone, polyvinyl butyral, polyphenylene ether, polyamide, polyetherimide, a norbornene-based resin, a methacryl resin, a thermoplastic resin such as cyclic polyolefin, an epoxy resins, a phenol resin, an urethane resin, an acrylic resin, a vinyl ester resin, an imide-based resin, an urethane-based resin, an urea resin, a thermosetting resin such as a melamine resin, polystyrene, polyacrylonitrile, and/or polycarbonate, though the bank 219 is not limited thereto. The bank 219 may include an inorganic oxide such as silicon oxide ($SiO_2$), silicon nitride ($SiN_x$), silicon oxynitride ($SiN_xO_y$), aluminum oxide ($AlO_x$), titanium oxide ($TiO_x$), tantalum oxide ($TaO_x$), zinc oxide ($ZnO_x$), and/or include an inorganic insulating material such as an inorganic nitride, though the bank 219 is not limited thereto. In some embodiments, the bank 219 may include an opaque material such as a black matrix. An insulating black matrix material may include an organic resin, glass paste, and/or a resin or paste including a black pigment, a metal particle, for example, nickel, aluminum, molybdenum or an alloy thereof, a metal oxide particle (e.g. a chrome oxide), and/or a metal nitride particle (e.g. a chrome nitride). In some embodiments, the bank 219 may include a dispersed Bragg reflector DBR having a high reflectivity, or a mirror reflector including metal.

The light-emitting diode ED, which is an inorganic light-emitting diode having a micro size, is arranged in the recessed portion RP of the bank 219. Here, micro may denote a size of about 1 μm to about 100 μm, though embodiments are not limited thereto and are applicable to a light-emitting diode having a larger or smaller size. The light-emitting diodes ED may be picked up individually or collectively from a wafer by a transfer mechanism, transferred to the substrate 200, and then received in the recessed portion RP of the substrate 200. In some embodiments, after the bank 219 and the first electrode 221 are formed, the light-emitting diode ED may be received in the recessed portion RP of the substrate 200. The light-emitting diode ED may emit light in a predetermined wavelength belonging to the wavelength range from ultraviolet light to visible light. For example, the light-emitting diode ED may include a red, green, blue, or white light-emitting diode LED, or an ultraviolet light-emitting diode LED.

The light-emitting diode ED may include a p-n diode 250, a first contact electrode 225, and a second contact electrode 227. The first contact electrode 225 and/or the second contact electrode 227 may include at least one layer and may include various conductive materials including metal, a conductive oxide, and/or conductive polymers. The first contact electrode 225 and/or the second contact electrode 227 may selectively include a reflective layer, for example, a silver layer. The first contact electrode 225 is electrically connected to the first electrode 221, and the second contact electrode 227 is electrically connected to the second electrode 223. The p-n diode 250 may include a p-doped layer 251 in the lower portion, at least one quantum well layer 253, and an n-doped layer 255 in the upper portion. In another embodiment, the doped layer 255 in the upper portion may be a p-doped layer, and the doped layer 251 in the lower portion may be an n-doped layer. The p-n diode 250 may have a straight line-shaped lateral wall or a lateral wall tapered from top to bottom or bottom to top.

The first electrode 221 may include a reflective electrode and may include at least one layer. For example, the first electrode 221 may include a metal such as aluminum, molybdenum, titanium, tungsten, silver, gold, or an alloy thereof. The first electrode 221 may include a transparent conductive oxide (TCO) such as ITO, IZO, ZnO, and/or $In_2O_3$, a transparent conductive layer, and a reflective layer, the transparent conductive layer including a conductive material such as a carbon nano tube film or a transparent conductive polymer. In some embodiments, the first electrode 221 may include a triple layer including a top transparent conductive layer, a bottom transparent conductive layer, and a reflective layer therebetween.

The second electrode 223 may include a transparent or semi-transparent electrode. For example, the second electrode 223 may include at least one of a transparent conductive oxide (TCO) such as ITO, IZO, ZnO, or $In_2O_3$, and a conductive material such as a carbon nano tube film or a transparent conductive polymer. The second electrode 223 serves as a common electrode that is common to the sub-pixels Ps and may be formed on an entire surface of the substrate 200.

A passivation layer 240 surrounds the light-emitting diode ED inside the recessed portion RP. The passivation layer 240 covers the bank 219 and the light-emitting diode ED. Because the passivation layer 240 is formed above the light-emitting diode ED, for example, at a height not covering the second contact electrode 227, the second contact electrode 227 is exposed. The passivation layer 240 may include an organic insulating material. For example, the passivation layer 240 may include at least one of acryl, polymethylmethacrylate (PMMA), benzocyclobutene (BCB), polyimide, acrylate, epoxy, and polyester. The second electrode 223 is formed on the passivation layer 240, the second electrode 223 being electrically connected to the exposed second contact electrode 227 of the light-emitting diode ED.

When voltages are applied to the first electrode 221 and the second electrode 223, the light-emitting diode ED emits light, and the size of each sub-pixel Ps may be defined by the recessed portion RP of the bank 219 in which the light-emitting diode ED is arranged.

Figure 17:
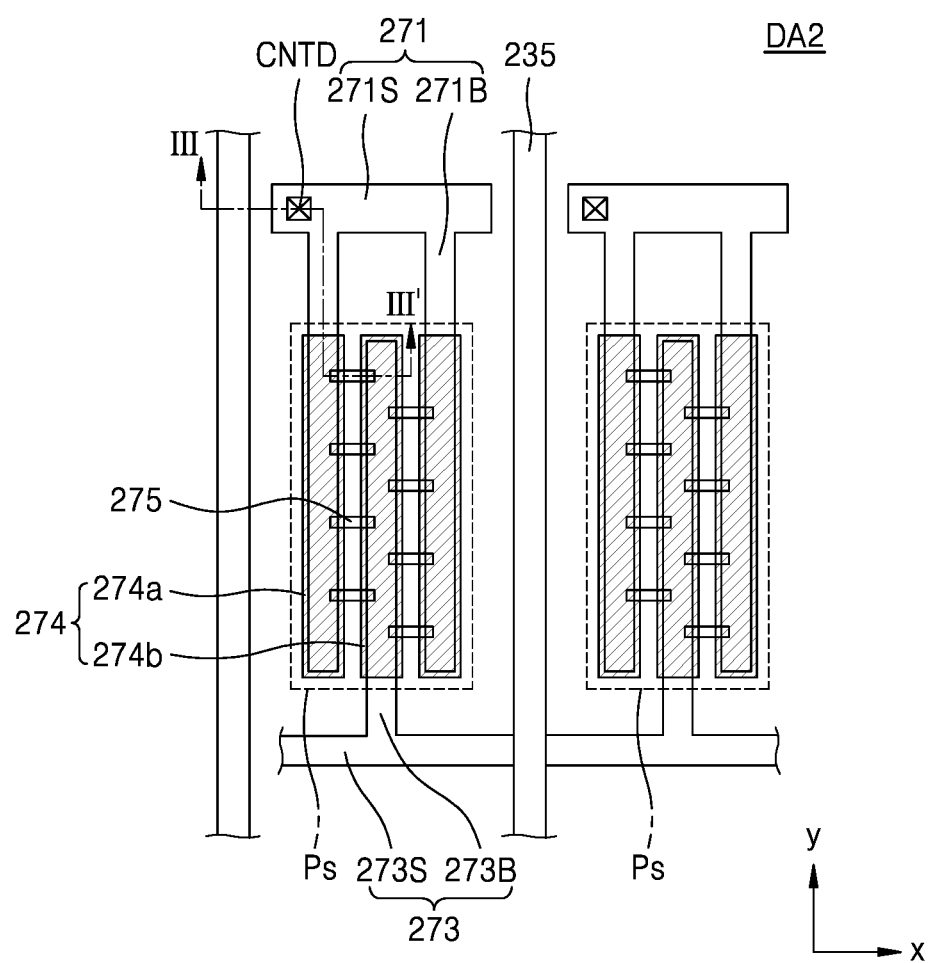
FIGS. 17 and 18 are plan views of the second display area of the second display panel according to further embodiments of the present disclosure.
Figure 18:
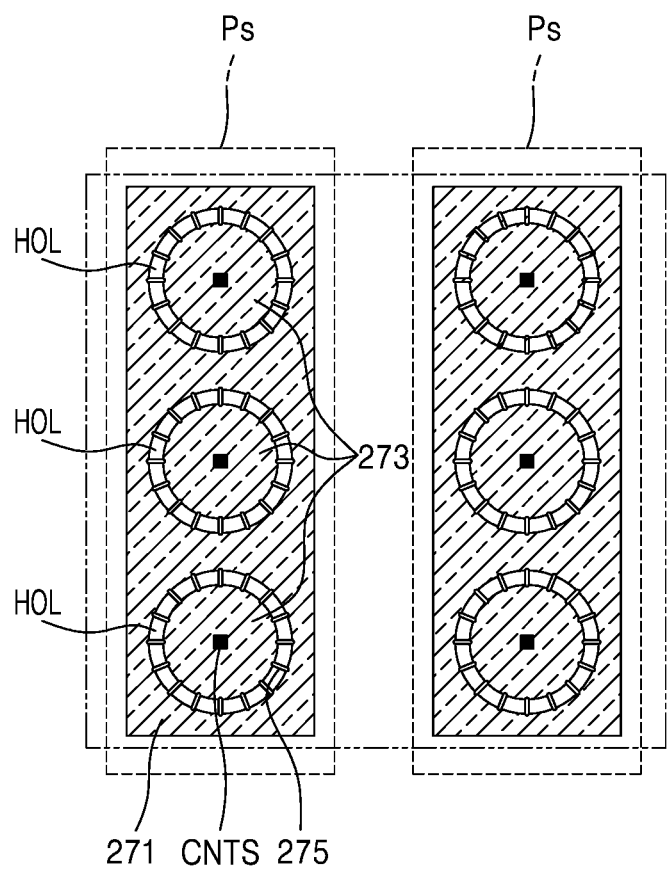

FIGS. 17 and 18 are plan views of the second display area DA2 of the second display panel 20 according to embodiments of the present disclosure.

Referring to FIG. 17, a sub-pixel Ps in the second display area DA2 may be implemented by a plurality of light-emitting diodes 275 (as shown in FIG. 18) provided as inorganic light-emitting diodes having a micro size or a nano size. The light-emitting diodes 275 may be arranged between a first electrode 271 and a second electrode 273 to emit light.

The first electrode 271 may include an anode electrode of the light-emitting diodes 275, and the second electrode 273 may include a cathode electrode of the light-emitting diodes 275. Each of the first electrode 271 and the second electrode 273 may include electrode stem portions 271S and 273S, and one or more electrode branch portions 271B and 273B, the electrode stem portions 271S and 273S extending in a first direction (e.g., an x-direction), and electrode branch portions 271B and 273B extending and branching from the electrode stem portions 271S and 273S in a second direction (e.g., a y-direction) intersecting the first direction (the x-direction).

The first electrode 271 may include the first electrode stem portion 271S and at least one first electrode branch portion 271B, the first electrode stem portion 271S extending in the first direction (e.g., the x-direction), and the first electrode branch portion 271B branching from the first electrode stem portion 271S and extending in the second direction (e.g., the y-direction).

The first electrode stem portion 271S may be electrically separated from a first electrode stem portion 271S that drives a sub-pixel Ps neighboring in the first direction (e.g., the x-direction). The first electrode stem portion 271S may be apart from the first electrode stem portion 271S of the sub-pixel Ps neighboring in the first direction (e.g., the x-direction). The first electrode stem portion 271S may be connected to a thin film transistor through a first electrode contact hole CNTD.

The first electrode branch portion 271B may be apart from the second electrode stem portion 273S in the second direction (e.g., the y-direction). The first electrode branch portion 271B may be apart from the second electrode branch portion 273B in the first direction (e.g., the x-direction).

The second electrode 273 may include the second electrode stem portion 273S and the second electrode branch portion 273B, the second electrode stem portion 273S extending in the first direction (e.g., the x-direction), and the second electrode branch portion 273B branching from the second electrode stem portion 273S and extending in the second direction (e.g., the y-direction).

The second electrode stem portion 273S may be connected to a second electrode stem portion 273S that drives a sub-pixel Ps neighboring in the first direction (e.g., the x-direction). The second electrode branch portion 273B may be apart from the first electrode stem portion 271S in the second direction (e.g., the y-direction). The second electrode branch portion 273B may be apart from the first electrode branch portion 271B in the first direction (e.g., the x-direction). The second electrode branch portion 273B may be arranged between the first electrode branch portions 271B in the first direction (e.g., the x-direction).

Though it is shown in FIG. 17 that the first electrode branch portion 271B and the second electrode branch portion 273B extend in the second direction (e.g., the y-direction), the embodiment is not limited thereto. For example, each of the first electrode branch portion 271B and the second electrode branch portion 273B may have a partially curved or bent shape, or one of the first electrode branch portion 271B and the second electrode branch portion 273B may surround the other of the first electrode branch portion 271B and the second electrode branch portion 273B.

It is shown in FIG. 18 as an example that the second electrode 273 has a circular shape, the first electrode 271 surrounds the second electrode 273, a circular hole HOL is formed between the first electrode 271 and the second electrode 273, and the second electrode 273 receives a cathode voltage through a second electrode contact hole CNTS. In the embodiment of FIG. 18, because light-emitting diodes 275 are arranged in various directions, uniform brightness may be provided at various viewing angles.

As long as at least some regions of the first electrode 271 and the second electrode 273 are apart from each other to face each other and a space in which the light-emitting diode 275 may be arranged is formed between the first electrode 271 and the second electrode 273, each of the first electrode branch portion 271B and the second electrode branch portion 273B may be formed in any shape.

The light-emitting diode 275 may be arranged between the first electrode 271 and the second electrode 273. One end of the light-emitting diode 275 may be electrically connected to the first electrode 271, and another end of the light-emitting diode 275 may be electrically connected to the second electrode 273. The plurality of light-emitting diodes 275 may be apart from each other. The plurality of light-emitting diodes 275 may be aligned to be substantially parallel to each other.

Figure 19:
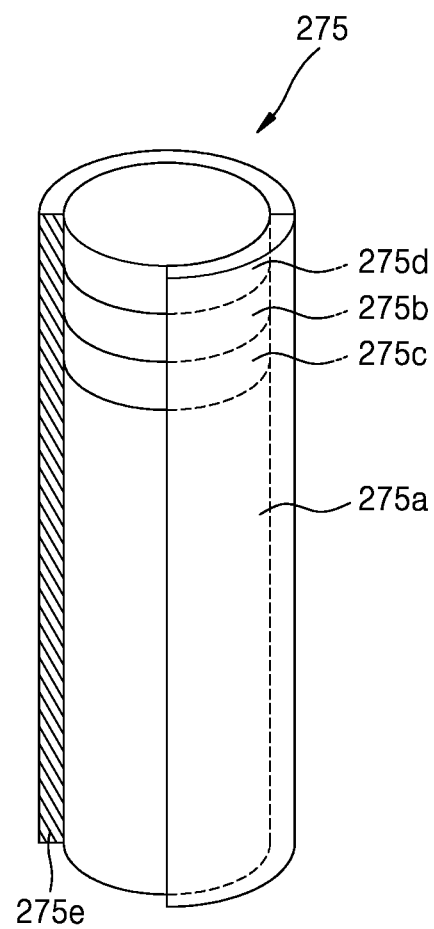
FIG. 19 is a perspective view of a light-emitting diode of FIGS. 17 and 18.

The light-emitting diode 275 may have a shape such as a rod, a wire, and a tube. For example, the light-emitting diode 275 may be formed in a cylindrical shape or a rod shape as shown in FIG. 19. However, the shape of the light-emitting diode 275 is not limited thereto and the light-emitting diode 275 may have a polyprism shape such as a cube, a rectangular parallelepiped, or a hexagonal prism, or have a shape extending in one direction and having a partially inclined outer surface. The length of the light-emitting diode 275 may have a range from about 1 µm to about 10 µm or from about 2 µm to about 6 µm, and preferably a range from about 3 µm to about 5 µm. In addition, the diameter of the light-emitting diode 275 may have a range from about 300 µm to about 700 µm, and the aspect ratio the light-emitting diode 275 may be about 1.2 to about 100.

As shown in FIG. 17, a contact electrode 274 may include a first contact electrode 274a and a second contact electrode 274b. The first contact electrode 274a and the second contact electrode 274b may have a shape extending in the second direction (e.g., the y-direction).

The first contact electrode 274a may be arranged over the first electrode branch portion 271B and connected to the first electrode branch portion 271B. The first contact electrode 274a may contact one end of the light-emitting diode 275. The first contact electrode 274a may be arranged between the first electrode branch portion 271B and the light-emitting diode 275. Therefore, the light-emitting diode 275 may be electrically connected to the first electrode 271 through the first contact electrode 274a.

The second contact electrode 274b may be arranged over the second electrode branch portion 273B and connected to the second electrode branch portion 273B. The second contact electrode 274b may contact another end of the light-emitting diode 275. The second contact electrode 274b may be arranged between the second electrode branch portion 273B and the light-emitting diode 275. Therefore, the light-emitting diode 275 may be electrically connected to the second electrode 273 through the second contact electrode 274b.

A width (or a length in the first direction (e.g., the x-direction)) of the first contact electrode 274a may be greater than a width (or a length in the first direction (e.g., the x-direction)) of the first electrode branch portion 271B, and a width (or a length in the first direction (e.g., the x-direction)) of the second contact electrode 274b may be greater than a width (or a length in the first direction (e.g., the x-direction)) of the second electrode branch portion 273B.

External banks 235 may be arranged between sub-pixels Ps. The external banks 235 may extend along the second direction (e.g., the y-direction). A length of each sub-pixel Ps in the first direction (e.g., the x-direction) may be defined by a distance between the external banks 235.

FIG. 19 is a perspective view of the light-emitting diode 275 of FIGS. 17 and 18.

Referring to FIG. 19, the light-emitting diode 275 may include a first semiconductor layer 275a, a second semiconductor layer 275b, an active layer 275c, an electrode layer 275d, and an insulating layer 275e.

The first semiconductor layer 275a may include, for example, an n-type semiconductor having a first conductive type. The first semiconductor layer 275a may include at least one of AlGaInN, GaN, AlGaN, InGaN, AlN, and InN doped with n-type impurities. For example, in the case where the light-emitting diode 275 emits light in a blue wavelength band, the first semiconductor layer 275a may include a semiconductor material having a chemical formula of $Al_xGa_yIn_{1-x-y}N$ ($0 \leq x \leq 1$, $0 \leq y \leq 1$, $0 \leq x+y \leq 1$). The first semiconductor layer 275a may be doped with first conductive type dopant such as silicon (Si), germanium (Ge), and/or tin (Sn). For example, the first semiconductor layer 275a may include n-GaN doped with n-type Si.

The second semiconductor layer 275b may include, for example, a p-type semiconductor having a second conductive type. The second semiconductor layer 275b may include at least one of AlGaInN, GaN, AlGaN, InGaN, AlN, and InN doped with p-type impurities. For example, in the case where the light-emitting diode 275 emits light in a blue or green wavelength band, the second semiconductor layer 275b may include a semiconductor material having a chemical formula of $Al_xGa_yIn_{1-x-y}N$ ($0 \leq x \leq 1$, $0 \leq y \leq 1$, $0 \leq x+y \leq 1$). The second semiconductor layer 275b may be doped with second conductive type dopant such as magnesium (Mg), zinc (Zn), calcium (Ca), selenium (Se), and/or barium (Ba). In an embodiment, the second semiconductor layer 275b may include p-GaN doped with p-type Mg.

The active layer 275c may be arranged between the first semiconductor layer 275a and the second semiconductor layer 275b. The active layer 275c may include a material having a single or multi-quantum well structure. In the case where the active layer 275c includes a material having a multi-quantum well structure, the active layer 275c may have a structure in which a quantum layer and a well layer are alternately stacked a number of times. Alternatively, the active layer 275c may have a structure in which a semiconductor material having a large band gap energy and a semiconductor material having a small band gap energy are alternately stacked, or may include Group 3 to Group 5 semiconductor materials depending on a wavelength band of emitted light.

The active layer 275c may emit light through recombination of an electron-electron pair according to an electric signal applied from the first semiconductor layer 275a and the second semiconductor layer 275b. Light emitted by the active layer 275c is not limited to light in a blue wavelength band. The active layer 275c may emit light in a red or green wavelength band. For example, in the case where the active layer 275c emits light in the blue wavelength band, the active layer 275c may include a material such as AlGaN and AlGaInN. For example, in the case where the active layer 275c has a multi-quantum well structure in which a quantum layer and a well layer are alternately stacked, the quantum layer may include a material such as AlGaN or AlGaInN, and the well layer may include a material such as GaN or AlInN. For example, the active layer 275c may include AlGaInN as the quantum layer and may include AlInN as the well layer. As described above, the active layer 275c may emit blue light having a central wavelength band ranging from about 450 nm to about 495 nm.

Light emitted from the active layer 275c may be emitted from not only a lengthwise outer surface of the light-emitting diode 275 but also from two opposite lateral surfaces of the light-emitting diode 275. That is, the directionality of light emitted from the active layer 275c is not limited to one direction.

The electrode layer 275d may include an Ohmic contact electrode or a Shottky contact electrode. The light-emitting diode 275 may include at least one electrode layer 275d. When the light-emitting diode 275 is electrically connected to the first electrode 271 or the second electrode 273, a resistance between the light-emitting diode 275 and the first electrode 271 or the second electrode 273 may be reduced due to the electrode layer 275d. The electrode layer 275d may include at least one conductive metal material such as aluminum (Al), titanium (Ti), indium (In), gold (Au), silver (Ag), ITO, IZO, and/or indium tin zinc oxide (ITZO). The electrode layer 275d may include a semiconductor material doped with n-type or p-type impurities. The electrode layer 275d may include the same material or different materials and is not limited thereto.

The insulating layer 275e may be arranged to surround the outer surfaces of the first semiconductor layer 275a, the second semiconductor layer 275b, the active layer 275c, and the electrode layer 275d. The insulating layer 275e protects the first semiconductor layer 275a, the second semiconductor layer 275b, the active layer 275c, and the electrode layer 275d. The insulating layer 275e may expose two opposite end portions of the light-emitting diode 275 in the lengthwise direction. That is, one end of the first semiconductor layer 275a and one end of the electrode layer 275d may be exposed without being covered by the insulating layer 275e. The insulating layer 275e includes (i.e., covers) the active layer 275c and may cover only a portion of an outer surface of the first semiconductor layer 275a and the second semiconductor layer 275b, and/or cover only a portion of the outer surface of the electrode layer 275d.

The insulating layer 275e may include materials having insulating characteristics, for example, silicon oxide ($SiO_x$), silicon nitride ($SiN_x$), silicon oxynitride ($SiO_xN_y$), aluminum nitride (AlN), and/or aluminum oxide ($Al_2O_3$). The insulating layer 275e may reduce or prevent an electrical short-circuit that may occur in the case where the active layer 275c directly contacts the first electrode 271 and/or the second electrode 273 through which an electric signal is transferred to the light-emitting diode 275. In addition, because the insulating layer 275e includes (.i.e., covers) the active layer 275c and protects the outer surface of the light-emitting diode 275, the deterioration of an emission efficiency may be reduced or prevented.

Figure 20:
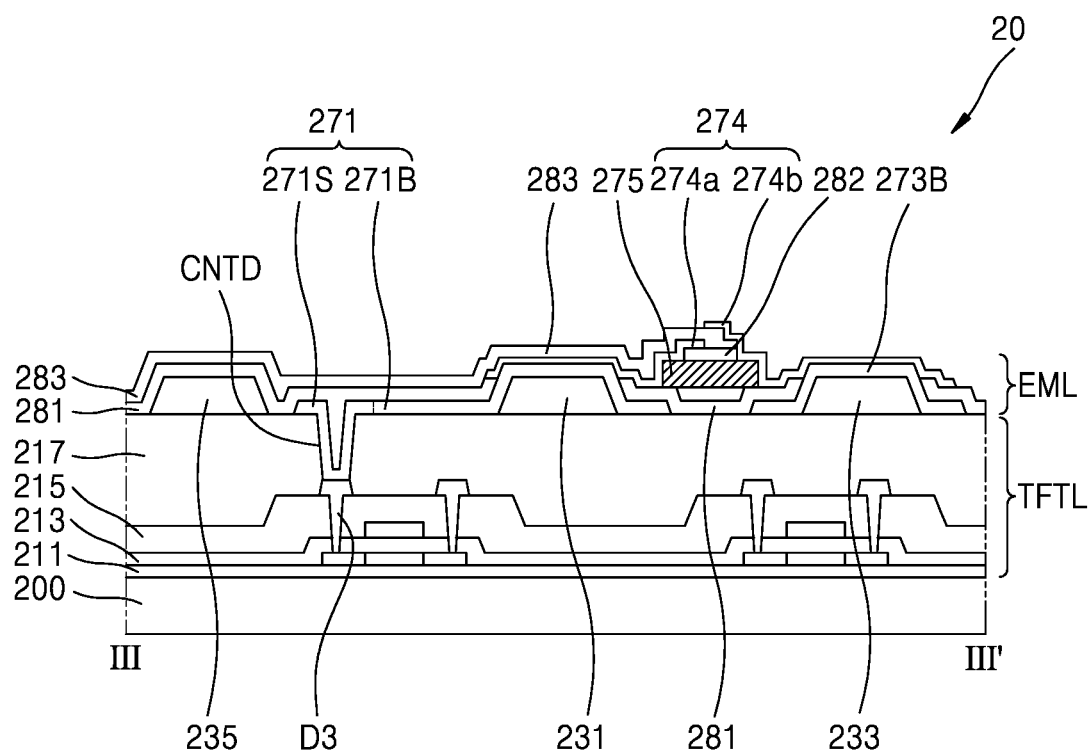
FIG. 20 is an example of a cross-sectional view taken along the line III-III' of FIG. 17.

FIG. 20 is a cross-sectional view of an example of the second display panel 20 taken along the line III-III' of FIG. 17.

Referring to FIG. 20, the second display panel 20 may include the thin film transistor layer TFTL and the emission element layer EML arranged on the substrate 200. The thin film transistor layer TFTL of FIG. 20 is substantially the same as that described with reference to FIG. 16.

The emission element layer EML may include a first inner bank 231, a second inner bank 233, the first electrode 271, the second electrode 273 (shown by the second electrode branch portion 273B in FIG. 20), the contact electrode 274, the light-emitting diode 275, a first insulating layer 281, a second insulating layer 282, and a third insulating layer 283.

The first inner bank 231, the second inner bank 233, and an external bank 235 may be arranged on the planarization layer 217. The first inner bank 231, the second inner bank 233, and the external bank 235 may protrude with respect to a top surface of the planarization layer 217. Though the first inner bank 231, the second inner bank 233, and the external bank 235 may have a trapezoidal cross-sectional shape, the embodiment is not limited thereto. Each of the first inner bank 231, the second inner bank 233, and the external bank 235 may include a bottom surface, a top surface, and lateral surfaces, the bottom surface contacting the top surface of the planarization layer 217, the top surface facing the bottom surface, and the lateral surfaces being between the top surface and the bottom surface. The lateral surfaces of the first inner bank 231, the lateral surfaces of the second inner bank 233, and the lateral surfaces of the external bank 235 may be inclined.

The first inner bank 231 may be apart from the second inner bank 233. The first inner bank 231 and the second inner bank 233 may include an organic layer including an acryl resin, an epoxy resin, a phenolic resin, a polyamide resin, and/or a polyimide resin.

The first electrode branch portion 271B may be arranged on the first inner bank 231, and the second electrode branch portion 273B may be arranged on the second inner bank 233. The first electrode branch portion 271B may be connected to the first electrode stem portion 271S, and the first electrode stem portion 271S may be connected to the drain electrode D3 of the thin film transistor TFT through the first electrode contact hole CNTD. Therefore, the first electrode 271 may receive a voltage from the drain electrode D3 of the thin film transistor TFT.

The first electrode 271 and the second electrode 273 may include a conductive material having a high reflectivity. For example, the first electrode 271 and the second electrode 273 may include metal such as silver (Ag), copper (Cu), and/or aluminum (Al). Therefore, light that progresses to the first electrode 271 and the second electrode 273 among light emitted from the light-emitting diode 275 may be reflected by the first electrode 271 and the second electrode 273 and may progress above the light-emitting diode 275.

The first insulating layer 281 may be arranged on the first electrode 271 and the second electrode branch portion 273B. The first insulating layer 281 may be arranged to cover the first electrode stem portion 271S, the first electrode branch portion 271B, and the second electrode branch portion 273B, the first electrode branch portion 271B being arranged on the lateral surfaces of the first inner bank 231, and the second electrode branch portion 273B being arranged on the lateral surfaces of the second inner bank 233. The first electrode branch portion 271B on the top surface of the first inner bank 231 and the second electrode branch portion 273B on the top surface of the second inner bank 233 may be exposed by not being covered by the first insulating layer 281. The first insulating layer 281 may be arranged on the external bank 235. The first insulating layer 281 may include an inorganic layer, for example, a silicon nitride layer, a silicon oxynitride layer, a silicon oxide layer, a titanium oxide layer, or an aluminum oxide layer.

The light-emitting diode 275 may be arranged on the first insulating layer 281 arranged between the first inner bank 231 and the second inner bank 233. One end of the light-emitting diode 275 may be adjacent to the first inner bank 231, and another end of the light-emitting diode 275 may be adjacent to the second inner bank 233.

The second insulating layer 282 may be arranged on the light-emitting diode 275. The second insulating layer 282 may include an inorganic layer, for example, a silicon nitride layer, a silicon oxynitride layer, a silicon oxide layer, a titanium oxide layer, or an aluminum oxide layer.

The first contact electrode 274a may be arranged on the first electrode branch portion 271B exposed and not covered by the first insulating layer 281, and may contact one end of the light-emitting diode 275. The first contact electrode 274a may also be arranged on the second insulating layer 282.

The third insulating layer 283 may be arranged on the first contact electrode 274a. The third insulating layer 283 may be arranged to cover the first contact electrode 274a to electrically separate the first contact electrode 274a from the second contact electrode 274b. The third insulating layer 283 may include an inorganic layer, for example, a silicon nitride layer, a silicon oxynitride layer, a silicon oxide layer, a titanium oxide layer, and/or an aluminum oxide layer.

The second contact electrode 274b may be arranged on the second electrode branch portion 273B exposed and not covered by the first insulating layer 281, and may contact another end of the light-emitting diode 275. The second contact electrode 274b may also be arranged on the second insulating layer 282 and the third insulating layer 283.

As described above, the respective sub-pixels Ps in the second display area DA2 may be implemented by the plurality of light-emitting diodes 275. The light-emitting diode 275 or ED driving the sub-pixel Ps described with reference to FIGS. 15 to 20 is applicable to the first display panel 10.

Figure 21:
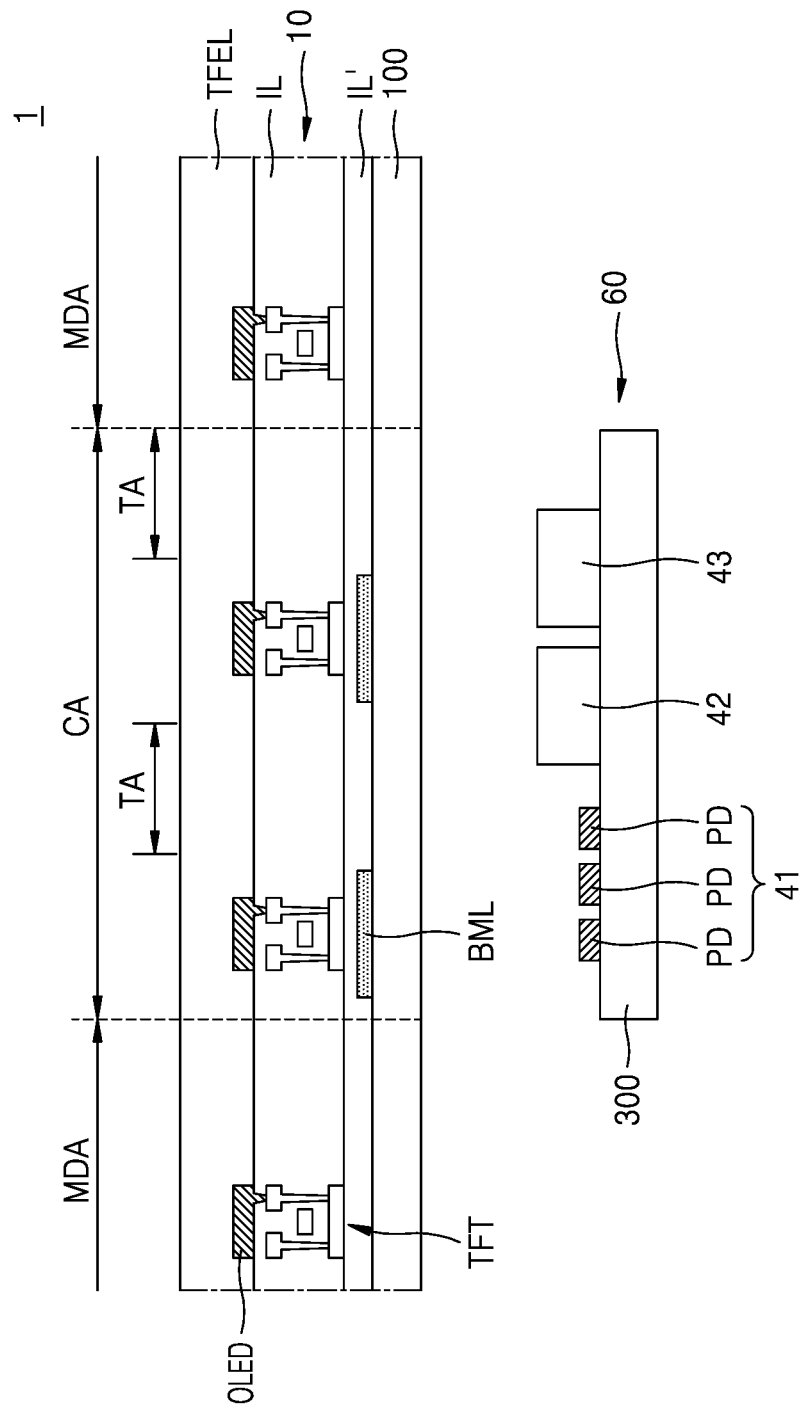
FIG. 21 is a cross-sectional view of a portion of the display device according to an embodiment.

FIG. 21 is a cross-sectional view of a portion of the display device 1 according to an embodiment. In FIG. 21, the same reference numerals as those of FIG. 2 denote the same members.

Referring to FIG. 21, the display device 1 includes the display panel 10 and a component chip 60.

The component chip 60 may be arranged to correspond to the component area CA of the display panel 10. The component chip 60 includes a substrate 300 and the plurality of components 41, 42, and 43 arranged on the substrate 300. That is, the plurality of components 41, 42, and 43 may be formed in one component chip 60 together. The substrate 300 may include a semiconductor chip package substrate. For example, the substrate 300 may include amorphous silicon.

The plurality of components 41, 42, and 43 may include the first component 41, the second component 42, and the third component 43 and each may have different functions. For example, the first component 41 may be an imaging device and may include an array including a plurality of photodiodes PD. The second component 42 may include an infrared sensor. The third component 43 may include a flash provided as a light-emitting diode. A driver of each component may be separately provided outside the component chip 60.

A plurality of light-emitting diodes implementing an image may be arranged on the component chip 60. Alternatively, the component chip 60 may be mounted on the second display panel 20 described with reference to FIGS. 13A and 13B. In such a case, the component chip 60 may move relative to the display panel 10 depending on a driving state of the display panel 10.

According to an embodiment, a display panel including an extended display area such that an image may be displayed even in a region in which a component, which is an electronic element, is arranged, and a display device including the display panel may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
    a first display panel configured to emit light in a first direction from first display elements to display an image, the first display panel comprising a main display area and a component area;
    a second display panel under the first display panel and comprising a second display area configured to emit light in the first direction from second display elements to display an image; and
    a component below the first display panel and configured to receive light from outside of the display device,
    wherein the second display area is at least partially surrounded by the main display area in a plan view.

2. The display device of claim 1, wherein the second display elements correspond to an edge of the component area, and
    the component overlaps the component area.

3. The display device of claim 2, wherein, when the display device is in use and displaying an image, the image displayed on the second display panel by the second display elements is displayed in cooperation with an image displayed in the component area.

4. The display device of claim 1, wherein the component area comprises a first component area and a second component area, and
    at least one of a resolution or a pixel arrangement structure of the first component area is different from that of the second component area.

5. The display device of claim 1, wherein the first display elements comprise a first auxiliary display element and a second auxiliary display element that are in the component area, and
    wherein a thickness of a first pixel electrode of the first auxiliary display element is greater than a thickness of a second pixel electrode of the second auxiliary display element, and the first pixel electrode comprises a reflective layer.

6. The display device of claim 1, wherein the first display elements comprise a first auxiliary display element in the component area, the first auxiliary display element comprising a pixel electrode comprising a first pixel electrode portion and a second pixel electrode portion, wherein the first pixel electrode portion and the second pixel electrode portion have different thicknesses, and
wherein the first pixel electrode portion comprises a first transparent electrode layer, a reflective layer, and a second transparent electrode layer that are stacked, and the second pixel electrode portion extends from the first transparent electrode layer.

7. The display device of claim 1, wherein the second display elements comprise inorganic light-emitting diodes, and each of the inorganic light-emitting diodes is between a first electrode and a second electrode that are located at different layers.

8. The display device of claim 1, wherein the second display elements comprise inorganic light-emitting diodes, and each of the inorganic light-emitting diodes is between a first electrode and a second electrode that are located at the same layer.

9. The display device of claim 1, wherein the component comprises a first component and a second component that are configured to perform different functions, and the first component and the second component are located at the same substrate.

10. The display device of claim 1, wherein a resolution of the main display area is greater than a resolution of the component area.

11. The display device of claim 1, wherein the first display panel comprises a substrate and a bottom metal layer, the bottom metal layer being between the substrate and the first display elements, and
the bottom metal layer defines a bottom-hole corresponding to at least a portion of the component area.

12. A display device comprising:
a first display panel configured to emit light in a first direction from first display elements to display an image, the first display panel comprising a main display area and a component area;
a second display panel under the first display panel and comprising a second display area configured to emit light in the first direction from second display elements to display an image; and
a component below the first display panel and configured to receive light from outside of the display device,
a movement driver configured to move the second display panel relative to the first display panel; and
a controller configured to control the movement driver,
wherein the component is on the second display panel and on one side of the second display area.

13. The display device of claim 12, wherein the movement driver is configured to move the second display panel according to a command of the controller such that the component corresponds to the component area when the component is operating, and
the movement driver is configured to move the second display panel according to a command of the controller such that the second display area corresponds to the component area when the component is not operating.

14. A display device comprising:
a first display panel configured to emit light in a first direction from first display elements to display an image, the first display panel comprising a main display area and a component area;
a second display panel under the first display panel and comprising a second display area configured to emit light in the first direction from second display elements to display an image; and
a component below the first display panel and configured to receive light from outside of the display device,
wherein the component comprises an imaging device, an infrared sensor, a solar battery, and/or a flash.

15. A display panel comprising:
a substrate comprising a main display area and a component area;
main display elements in the main display area; and
auxiliary display elements in the component area,
wherein the auxiliary display elements comprise first auxiliary display elements and second auxiliary display elements, and
wherein a thickness of a first pixel electrode of the first auxiliary display elements is greater than a thickness of a second pixel electrode of the second auxiliary display elements, and the first pixel electrode comprises a reflective layer.

16. The display panel of claim 15, wherein a pixel arrangement structure of main sub-pixels comprising the main display elements is the same as a pixel arrangement structure of auxiliary sub-pixels comprising the auxiliary display elements.

17. The display panel of claim 15, wherein a first sub-pixel comprising one or more of the first auxiliary display elements is smaller than a second sub-pixel comprising one or more of the second auxiliary display elements and configured to display the same color as the first sub-pixel.

18. The display panel of claim 15, wherein the first auxiliary display elements and the second auxiliary display elements are provided as one body,
the first pixel electrode comprises a first transparent electrode layer, a reflective layer, and a second transparent electrode layer, and
the second pixel electrode extends from the first transparent electrode layer.

19. The display panel of claim 15, further comprising a bottom metal layer between the substrate and the first auxiliary display elements,
wherein the bottom metal layer defines a bottom-hole corresponding to the second auxiliary display elements.

20. The display panel of claim 15, wherein a resolution of the main display area is greater than a resolution of the component area.

* * * * *